United States Patent [19]
Custode

[11] Patent Number: 5,114,874
[45] Date of Patent: May 19, 1992

[54] METHOD OF MAKING A SUB-MICRON NMOS, PMOS AND CMOS DEVICES WITH METHODS FOR FORMING SUB-MICRON CONTACTS

[75] Inventor: Frank Z. Custode, Norco, Calif.

[73] Assignee: Rockwell International Corporation, El Segundo, Calif.

[21] Appl. No.: 529,982

[22] Filed: May 30, 1990

Related U.S. Application Data

[63] Continuation-in-part of Ser. No. 73,591, Jul. 15, 1987, Pat. No. 4,942,225.

[51] Int. Cl.$^5$ .................................... H01L 21/70
[52] U.S. Cl. ............................ 437/57; 437/34; 437/41; 437/186; 437/193; 148/DIG. 20; 357/34
[58] Field of Search ............... 437/34, 41, 186, 193; 148/DIG. 20

[56] References Cited

U.S. PATENT DOCUMENTS

| | | | |
|---|---|---|---|
| 4,494,304 | 1/1985 | Yoshioka | 437/41 |
| 4,694,565 | 9/1987 | Custode | 437/41 |
| 4,697,328 | 10/1987 | Custode | 437/41 |
| 4,868,137 | 9/1989 | Kubota | 437/41 |
| 4,945,070 | 7/1990 | Hsu | 437/34 |
| 4,947,225 | 8/1990 | Custode | 357/34 |
| 4,957,881 | 9/1990 | Crotti | 437/51 |

Primary Examiner—Brian E. Hearn
Assistant Examiner—Gordon V. Hugo
Attorney, Agent, or Firm—H. Fredrick Hamann; George A. Montanye; Wilfred G. Caldwell

[57] ABSTRACT

The sub-micron NMOS, PMOS and CMOS devices with methods for forming sub-micron contacts provide sub-micron devices and processes for manufacturing them with contacts down to 0.1 microns or less. All processes and devices utilize doped polysilicon as the electrodes for the device elements, and the preferred embodiment surrounds the polysilicon contacts with low temperature oxide covered by SOG which avoids all oxidation steps that could be detrimental in this contact size range. An optional alternative includes large contact area enlarging layers of silicide directly beneath each contact.

10 Claims, 29 Drawing Sheets

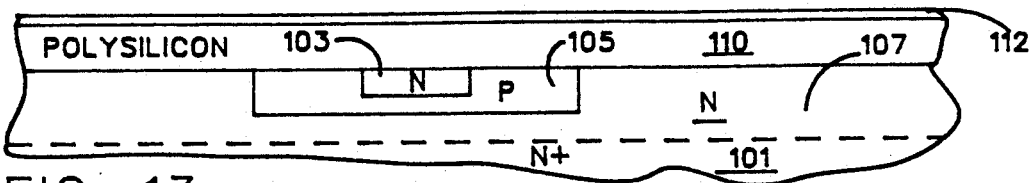
FIG. 13
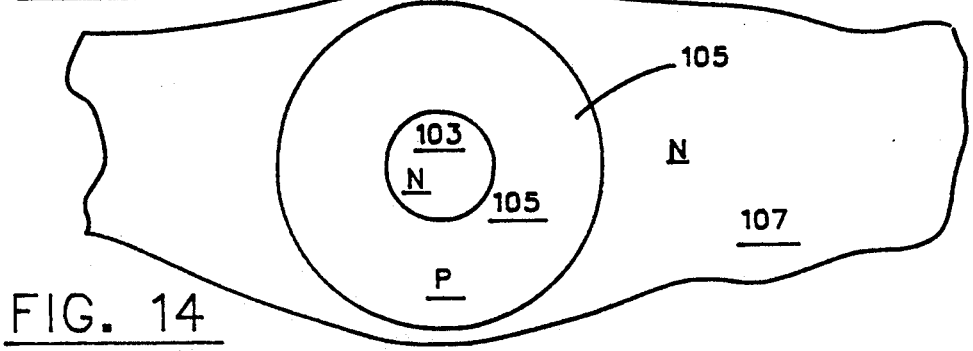
FIG. 14
FIG. 14A
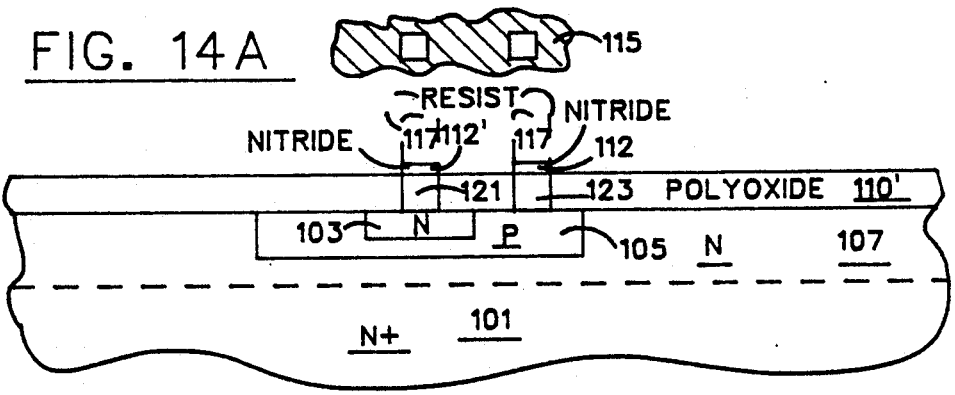
FIG. 15
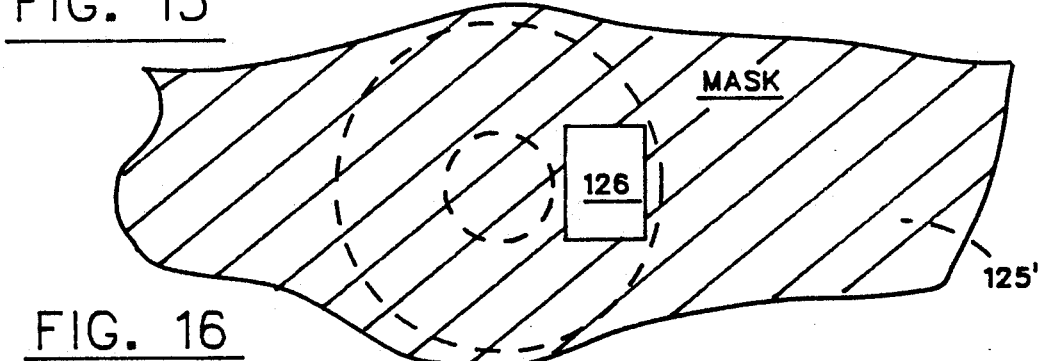
FIG. 16
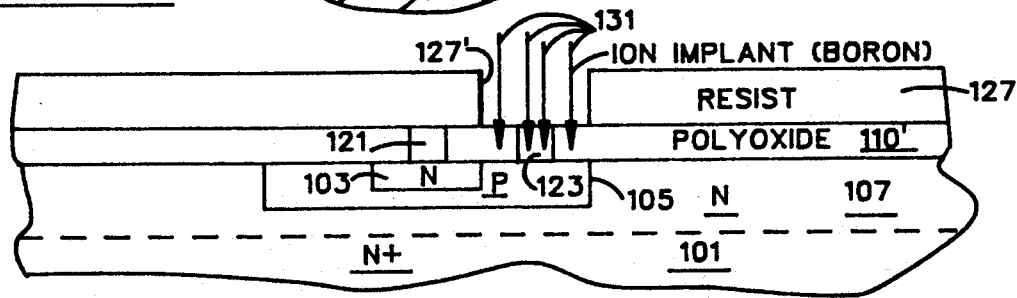
FIG. 17

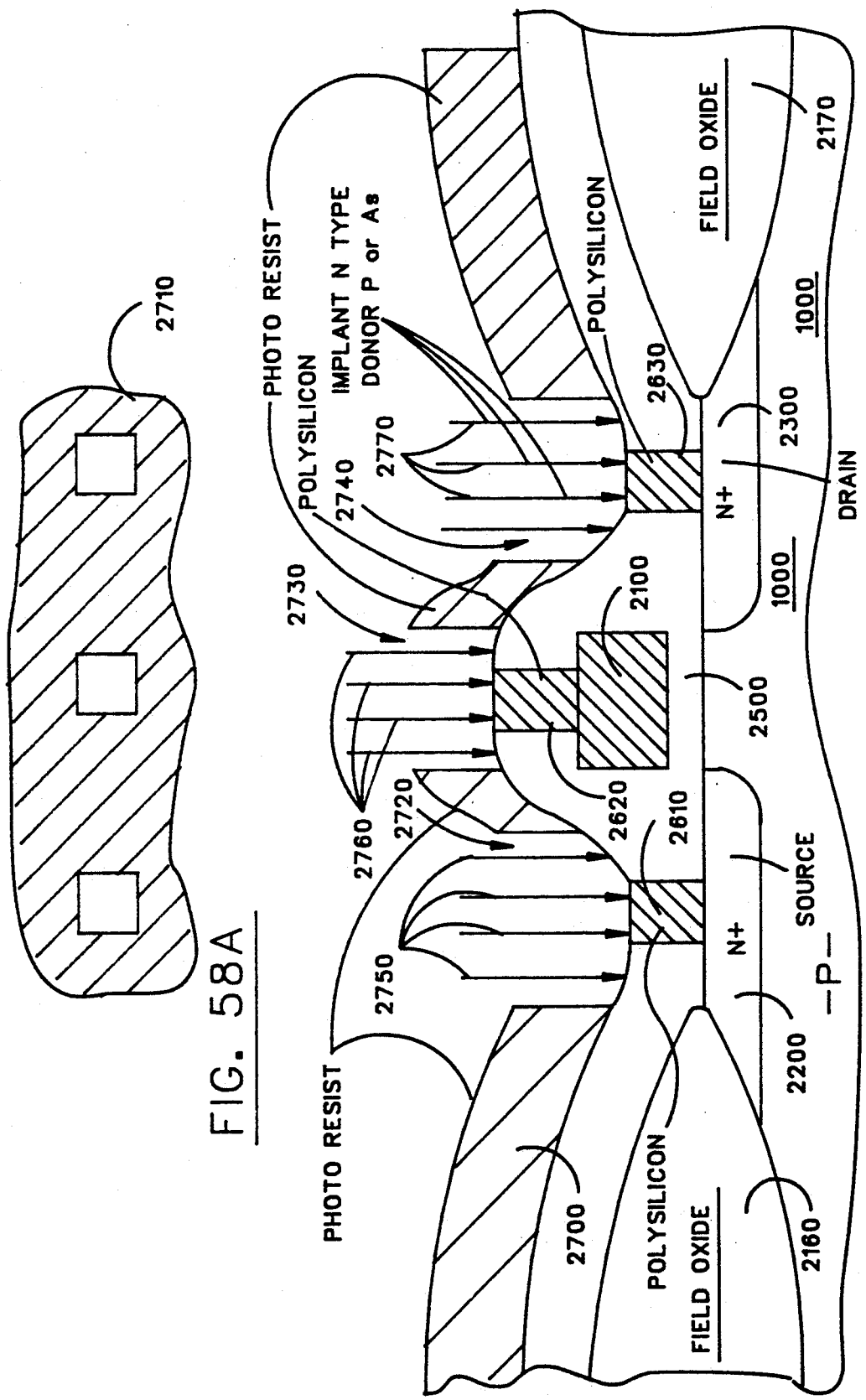

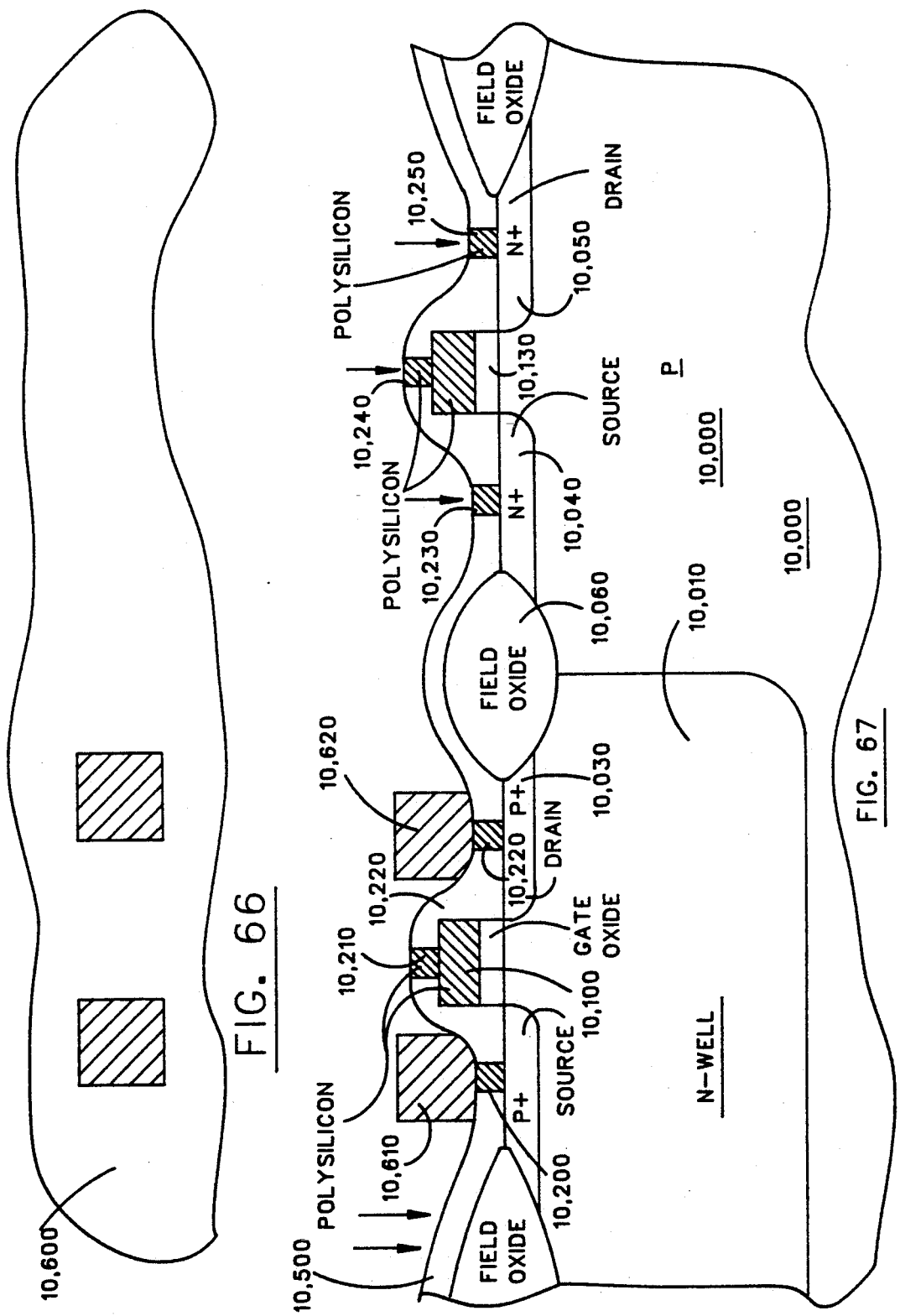

METHOD OF MAKING A SUB-MICRON NMOS, PMOS AND CMOS DEVICES WITH METHODS FOR FORMING SUB-MICRON CONTACTS

CROSS REFERENCE

This application is a continuation-in-part of my U.S. Pat. application Ser. No. 073,591, filed Jul. 15, 1987, now U.S. Pat. No. 4,942,225 and entitled Sub-Micron Devices With Method For Forming Sub-Micron Contacts.

FIELD OF THE INVENTION

The invention provides sub-micron VLSI devices, particularly of the NMOS, PMOS and CMOS types with contacts of the order of 1.0 down to 0.1 microns.

BACKGROUND OF THE INVENTION

A severe limitation for large scale integration is the lack of adequate registration from layer to layer during the fabrication process. These mis-registrations result in the introduction of guards/protections which enlarge the real estate area needed for a particular circuit layout.

In addition to registration problems, there is difficulty in preserving dimensional control when etching contacts or vias.

Another problem is caused by the steep walls generated during the making of conventional contacts/vias. Etching steps result in discontinuities of metal lines. Furthermore, metal has the propensity for spiking through shallow junctions forming sources and drains. As dimensions reach the sub-micron sizes, the problems mentioned above exacerbate exponentially.

SUMMARY OF THE INVENTION

A novel way of solving these problems is presented herein. By selectively oxidizing a single layer of polysilicon, contact sizes down to the order of 0.1 by 0.1 microns or 0.1 micron diameter can be realized.

The invention can be applied to MOS (n-, p-, CMOS), Bipolar, or GaAs devices. In general, once the diffusion regions have been formed, an oversized contact mask is applied and the insulating layer (oxide) etched so as to expose the substrate material or that to be accessed. Next, a layer of undoped polysilicon is deposited; here, the thickness of this polysilicon layer must be selected according to the desired size of the contact to be fabricated, and planarization of the insulation desired. For instance, for a contact size of 0.1 by 0.1 microns, the layer of polysilicon can be approximately 1000 angstroms. Then, a thin layer of silicon nitride is deposited on top of the polysilicon. With the aid of the contact mask, nitride contact buttons are delineated with photoresist. Next, the underlying layer of unprotected nitride is selectively etched, the photoresist is removed and the exposed polysilicon is oxidized. The nitride buttons protect the polysilicon underneath, hence preventing oxidation. The nitride is selectively removed from the contact areas. Next, the proper doping is performed by ion implantation and photoresist masking steps. Then, a layer of metal is deposited over the entire wafer, patterned with the aid of a metallization mask over a photoresist layer; the metal is etched and the photoresist is removed. Then, the devices are sintered to complete the fabrication process.

Alternatively, in lieu of oxidizing the polysilicon, the poly contact whiskers may be covered with low temperature oxide, followed by a layer of SOG. The tops of the poly whiskers are uncovered for doping of the contacts, as above. Another option is the forming of a large area of silicide across the source, drain and gate regions underneath their respective whiskers or contacts to make available a much larger number of atoms to give up electrons for whisker or contact current, as in FIGS. 55-72.

BRIEF DESCRIPTION OF THE DRAWINGS

FIG. 13 shows the steps for commencing the fabrication of the small contacts by employing a layer of polysilicon covered by a layer of nitride;

FIG. 14 shows the device of FIG. 13 in top plan view;

FIG. 14A is a mask for retaining resist over nitride button areas for contacts to the collector and base regions;

FIG. 15 shows the nitride buttons protected by the resist with the nitride layer otherwise removed and a portion of the polyoxide removed, the polysilicon having been converted to polyoxide where uncovered by the nitride removal;

FIG. 16 shows the mask for opening the contact region for the base;

FIG. 17 shows the ion implanting of boron ions through this opening into the base contact region to dope the polysilicon base electrode;

FIG. 58A shows the contact mask of FIG. 58;

FIG. 58 shows the NMOS structure with oversized contact openings through a layer of resist over the polysilicon occassioned by oversized openings in a contact mask of FIG. 58A;

FIG. 66 shows the mask which protects the P regions and opens all N regions (PMOS gate, NMOS source, drain and gate) for N doping;

FIG. 67 shows the doping step;

FIG. 71 is the finished CMOS device with silicide contact area enlarger dotted-in;

DESCRIPTION OF THE PREFERRED EMBODIMENT

Figure 1:
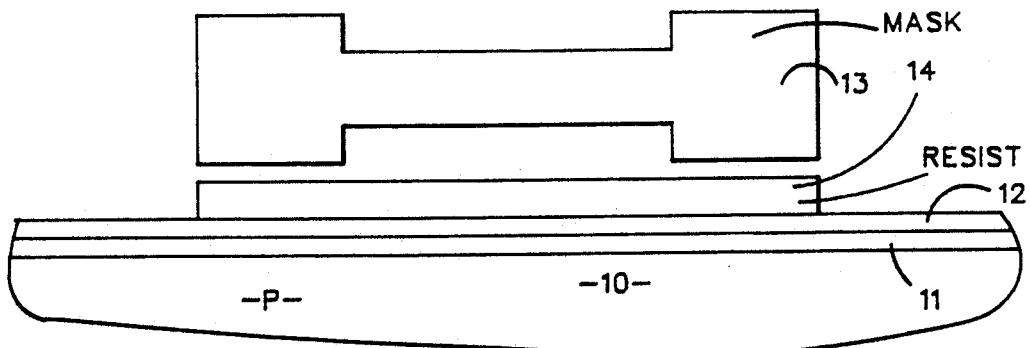
FIG. 1 is a view of the active region mask relative to a wafer with a layer of oxide and nitride as a conventional step in surrounding the active region with field oxide.
Figure 2:
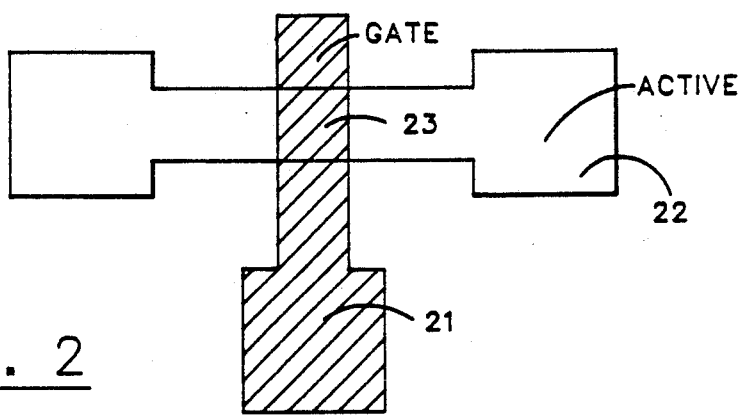
FIG. 2 shows the polysilicon delineated for the gate.

The steps shown in FIGS. 1 through FIG. 2 are conventional steps leading to the structure of FIG. 2 wherein processing is directed to the fabrication of the sub-micron contacts.

Thus, in FIG. 1, P doped silicon wafer 10 is first thermally oxidized to produce the silicon oxide layer 11, followed by a deposit of nitride layer 12, and the use of active region mask 13 to delineate photoresist 14 over the nitride layer 12.

Figure 1A:
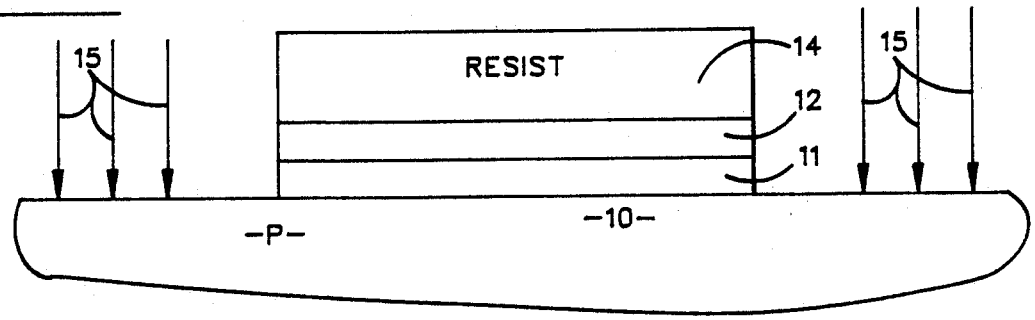
FIG. 1A shows the removal of the oxide and nitride from the regions other than the active areas.

The resist 14 permits etching away of the nitride layer 12 and oxide layer 11 everywhere except in the protected active region in order to provide for the field implant, shown as the boron ions implanted into the wafer 10 everywhere except in the active regions, as best seen in FIG. 1A. A 70 Kev implant is used at a dose of $8 \times 10^{12}$ ions/cm$^2$.

Figure 1B:
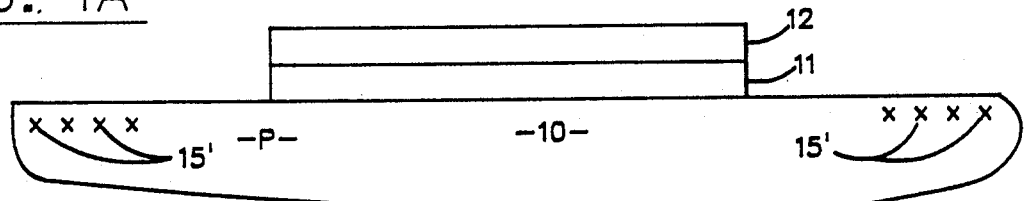
FIG. 1B shows the nitride layer to be used as the mask during oxidation.

In FIG. 1B, the resist 14 has been removed and the ion implant is illustrated at 15'.

Figure 1C:
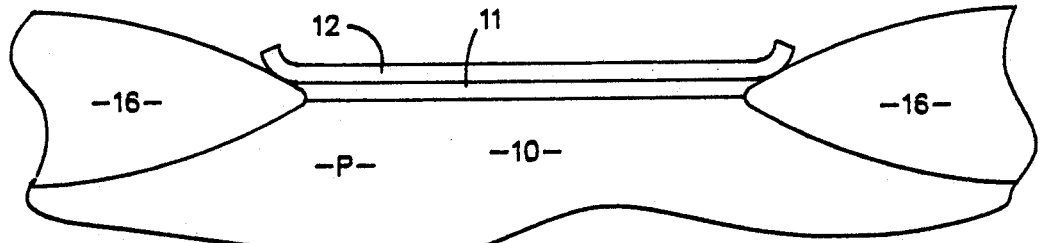
FIG. 1C shows the field oxide grown.

In FIG. 1C, the field oxide 16 is grown using the nitride layer 12 to prevent oxidation in the active region.

Figure 1D:
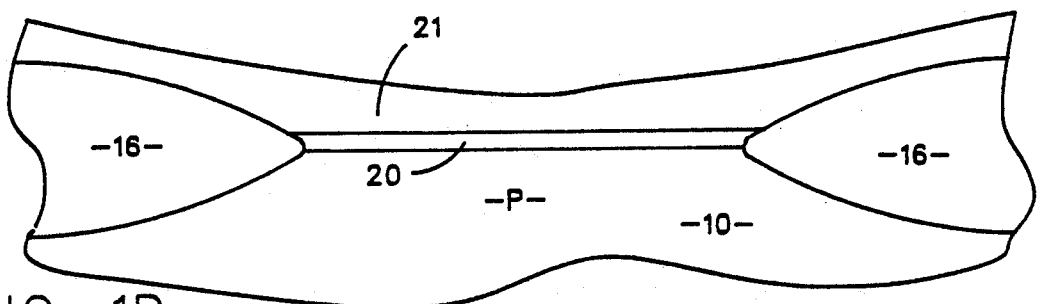
FIG. 1D shows the layer of polysilicon over the oxidized wafer and field oxide.

Next, the nitride layer 12 and oxide 11 are stripped, followed by growing gate oxide 20 in FIG. 1D.

In FIG. 1D, a layer of deposited polysilicon 21 is shown over the gate oxide 20.

FIG. 2 shows the structure after employing a gate mask to delineate the polysilicon 21 relative to the active region 22. The polysilicon 21 forms the gate electrode 23.

Figure 3:
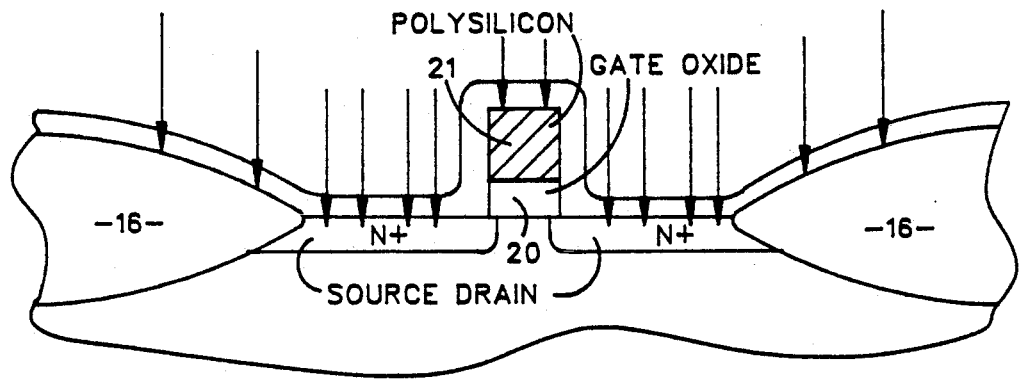
FIG. 3 shows source and drain activation by phosphorus implant.

In FIG. 3, the first step of growing a thin oxide layer 25 of approximately 200 to 600 angstroms thick is pursued toward delineating the contacts.

Figure 4A:
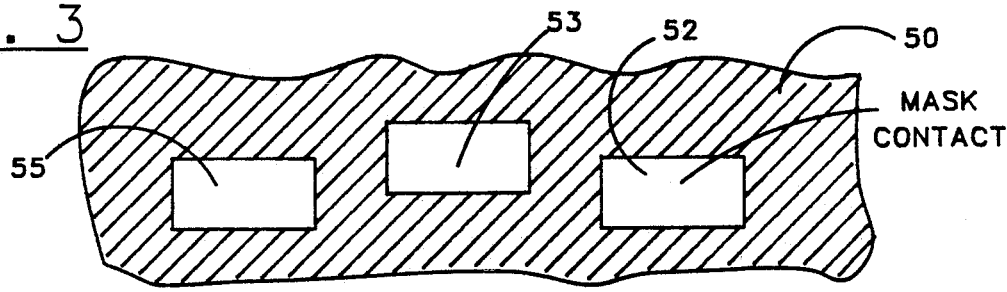
FIG. 4A shows a contact mask.
Figure 4:
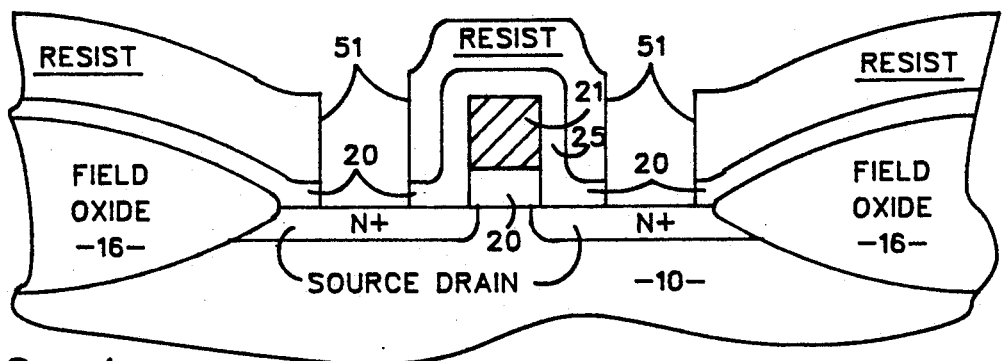
FIG. 4 shows the structure after extra large contact apertures have been opened to the bare silicon.
Figure 5:
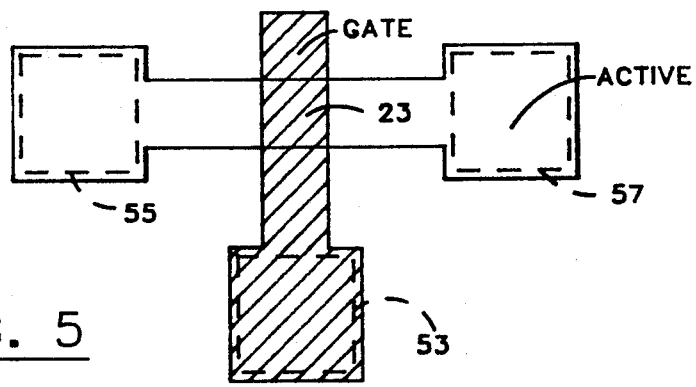
FIG. 5 is an overview of the opened contact openings in the structure as seen in top plan view.

FIGS. 4 and 4A show the wafer 10 opened to bare silicon by contact mask 50. Photoresist 51 is applied over the structure of FIG. 3 and mask 50 is used to open both the photoresist 51 and the oxide 20 in the source and drain region. These contact regions are made extra large in order that registration errors may be minimized in arriving at the final product. The opening 53 in mask 50 is illustrated in FIG. 5 for the gate contact region 53, source opening 55 being designated by the left opening in contact mask 50 and drain opening designated by the right aperture 57.

Figure 7:
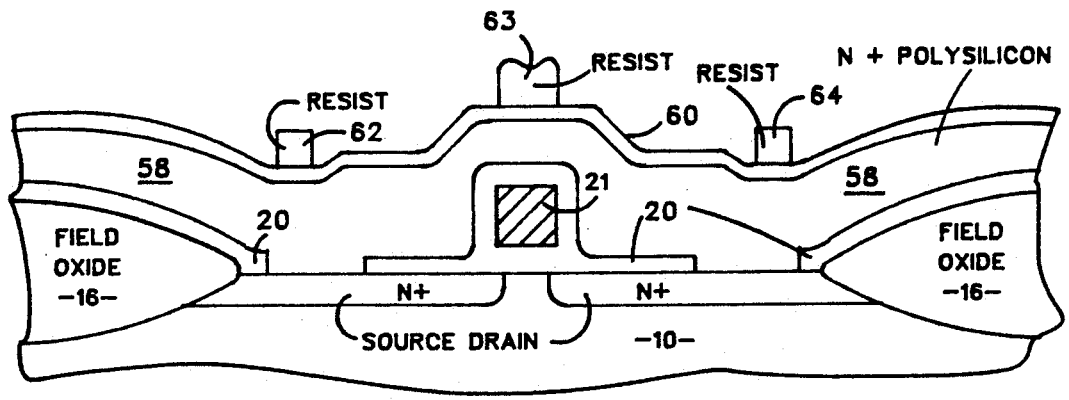
FIG. 7 shows the resist being retained in the three contact areas over the nitride layer.

In FIG. 7, an N+ doped polysilicon layer 58 is deposited on the previous structure to a thickness of approximately 2000 angstroms for fabricating contacts of the order of 0.1 microns by 0.1 microns (thinner polysilicon can be used for even smaller contacts). In general, for optimum results, 5000 angstroms of polysilicon may be used for contacts over 3 microns, 3000 angstroms for contacts of 1½ microns and 1000 microns for contacts of the order of 0.1-0.2 microns. Depending upon the equipment available and the level of skill of the operators, these figures may require slight adjustment, but they may be extrapolated and successfully used for an initial run.

However, in the cases where it is necessary to etch half of the polysilicon layer away, prior to oxidation in order to maintain planarization, the polysilicon thickness is simply doubled, (i.e.) 1000 angstroms becomes 2000 angstroms.

The next step is to deposit nitride 60 to a depth of about 1000 angstroms.

Figure 6:
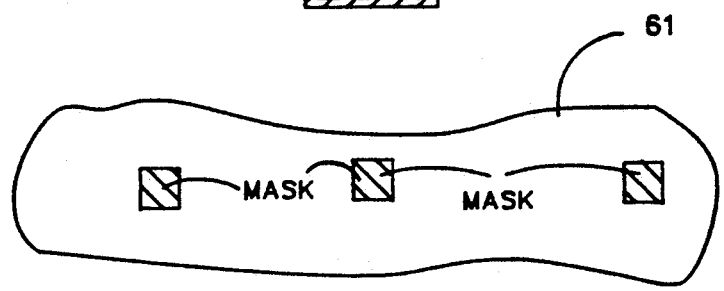
FIG. 6 is a mask for developing nitride buttons over the contact regions.

Then the contact mask 61 of FIG. 6 is employed to delineate the protective resist 62 over the source, resist 63 over the gate, and resist 64 over the drain.

The next step is to etch the nitride layer 60 and approximately one half of the polysilicon while the three regions are protected by the photoresist. This is achieved by employing an anisotropic etch conventionally to remove one half of the polysilicon and all of the unprotected nitride, the buttons being protected by the resist. Then, the resist is stripped and the unprotected polysilicon 58 is oxidized to become oxide 58'. Nitride buttons 60A, 60B and 60C cover the unoxidized polysilicon 58 over the source, gate and drain.

Figure 8:
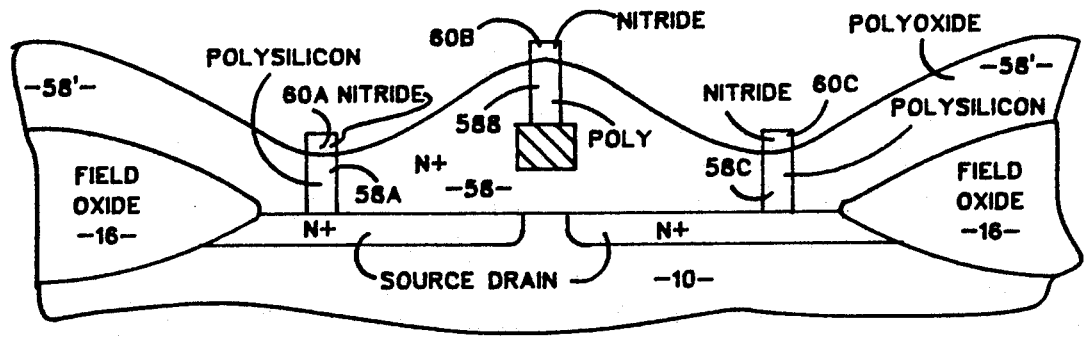
FIG. 8 shows the nitride removed except where it was covered by the resist and the polysilicon converted to polyoxide except in the electrode regions protected by the nitride buttons.
Figure 9:
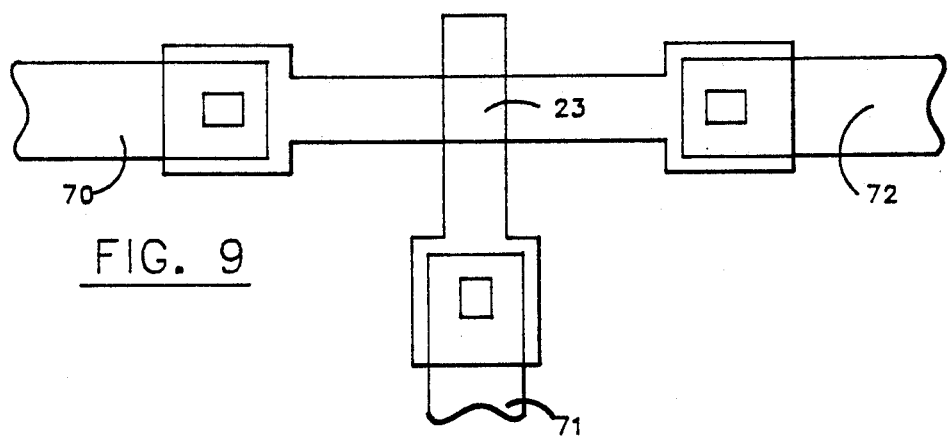
FIG. 9 is a view in plan of the interconnects and contact regions.
Figure 10:
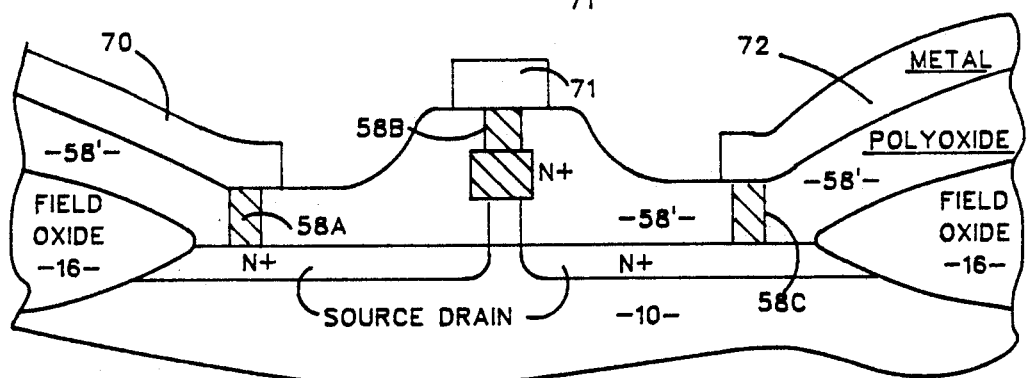
FIG. 10 shows the completed device with the sub-micron contacts.

FIGS. 9 and 10 show the finished NMOS device. In the structure of FIG. 8, the nitride buttons 60A, 60B and 60C are stripped thereby leaving the polysilicon 58A source. electrode, polysilicon 58B gate electrode and polysilicon 58C drain electrode in the polyoxide 58'.

The next step is to deposit aluminum silicon followed, by masking the metal to delineate the source conductor or interconnect 70, gate interconnect 71 and drain interconnect 72.

In the prior art, the minimum overlap of active region (active mask 13, FIG. 1 and contact regions, FIG. 5) relative to contact (electrode areas 58) had to be at least 0.8 microns. But, in the present invention, since the electrodes 58 are doped with the same material as the source and drain junctions (N+) being connected, there is no possibility for the metal interconnect to short circuit from junction to substrate, as is the problem with the prior art resulting in the requirements for large area overlap.

The electrodes, being polysilicon, prevent the metal from spiking through shallow junctions (i.e.) submicron type junctions.

The contacts (electrodes) are of the order of 0.1 microns because:

(a) photoresist and nitride delineate the electrodes, (b) electrode integrity is maintained by rapid oxidation of the surrounding polysilicon while the polysilicon under the nitride button is preserved, and (c) in the event irregularities are encountered, larger contacts may be employed, such as 0.3 microns, to leave an effective contact size of 0.1 microns.

These factors are common to all oxidized embodiments of this invention.

In FIGS. 6 and 7, significant steps are illustrated for making the sub-micron contacts. It is necessary that the polysilicon 58 make contact with the already formed sources and drains because the delineated electrodes 58A and 58C are polysilicon which is covered by the nitride buttons 60A and 60C. The dimensions of these electrodes is established by the solid regions of mask 61. The masks are used for larger sizes. For smaller sizes, the E-beam is blanked out for these regions when making contacts down to 0.1 by 0.1 microns under computer control. Many current E-beam micro-fabricators have spot sizes down to 0.1 microns, or less.

Thus, oxidation of the polysilicon unprotected by the nitride buttons fixes these sub-micron contact areas.

These techniques obtain throughout all oxidized embodiments presented herein.

The closest known prior art is U.S. Pat. No. 4,231,051 which discloses techniques for manufacturing a Totally-Self-Aligned Transistor; here, gates, contacts, and active areas are aligned to each other as a result of induced self-alignment during fabrication.

The present invention and this patent are both assigned to the same entity, and the subject inventor is a co-inventor of the patent.

The present invention improves over the patent by a technique which eliminates "sidewalk" effects by creating a flat field, thus, eliminating the "111" transition region from active to field regions. Also, overlap of gate electrode over field regions is totally eliminated by routing gate electrode metal interconnect by running it over the source or drain, thus inducing radiation hardness. This is particularly desirable in sub-micron devices for general use by the military, and in commercial space applications.

Figure 11:
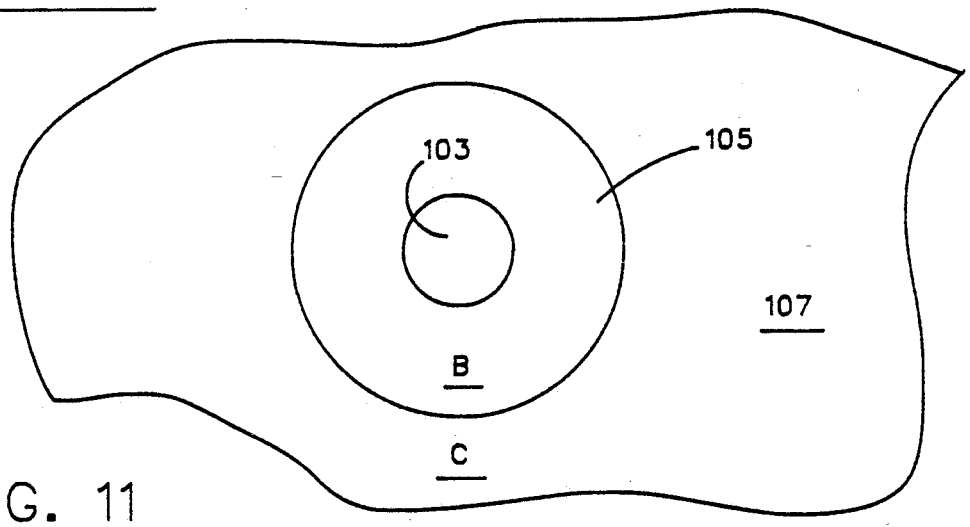
FIG. 11 is a view in top plan of a conventional bipolar device constructed to the stage of FIGS. 11 and 12 by conventional means.
Figure 12:
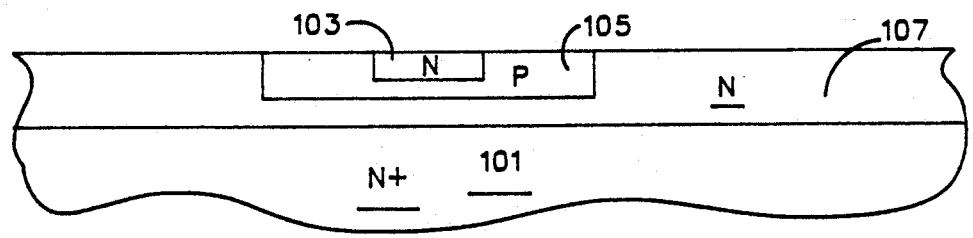
FIG. 12 is a view in cross-section of the bipolar device.

FIGS. 11 and 12 illustrate a conventional bipolar transistor structure wherein the wafer 101 is doped N+ and the emitter 103 is defined and diffused with n-type dopant, the base 105 is similarly defined and diffused with p-type dopant and the collector 107 is doped n-type.

This basic structure can be produced by any of the conventional processing techniques to this stage ready to receive the sub-micron contacts through processing steps described hereinafter.

In FIG. 13, a layer of undoped polysilicon 110 is deposited over wafer 101 with a layer of nitride 112 deposited over the polysilicon layer 110. The thickness of the polysilicon layer 110 is preferably 2000 angstroms (for 0.2 micron contacts) approximately and the thickness of the nitride layer 112 is approximately 1000 angstroms.

The next step is to mask the contact regions using contact mask 115 of FIG. 14A to retain photoresist 117 over nitride buttons 112' and 112" for the emitter 103 contact and the base 105 contact. This permits anisotropic etching to be carried on conventionally to remove approximately one half of the polysilicon thickness and all of the nitride, except where protected by photoresist 117, i.e., the buttons.

After the resist 117 is stripped, the polysilicon 110 is oxidized into polyoxide 110'. It should be noted that approximately half or 1000 angstroms of the polysilicon 110 was etched away, along with the nitride 112, such that when the polysilicon is oxidized into polyoxide 110', the level of the top is approximately coplanar to the original level of the top of the polysilicon 110. However, at the start of oxidation, the thickness of the polysilicon was 1000 angstroms to produce 0.1 micron contacts.

The nitride contact buttons 112' and 112" are etched away because they have served their purpose of protecting the polysilicon electrode regions 121 and 123 for the emitter 103 and base 105 from oxidation when the polysilicon layer 110 was converted to polyoxide 110'.

Figure 18:
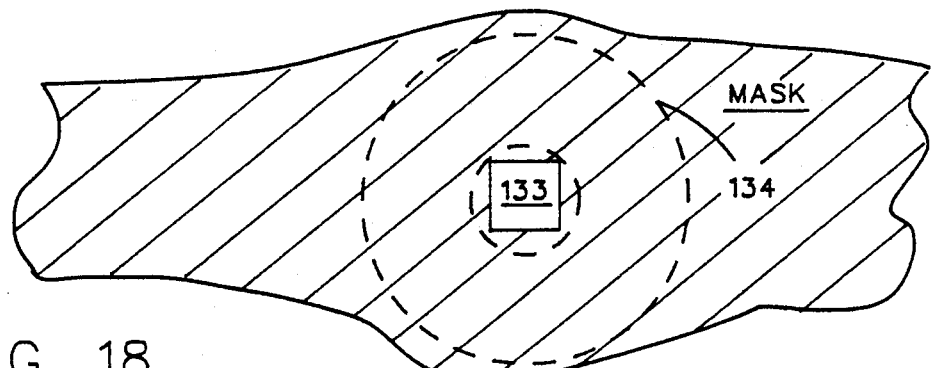
FIG. 18 shows the mask for opening the contact region over the collector electrodes.
Figure 19:
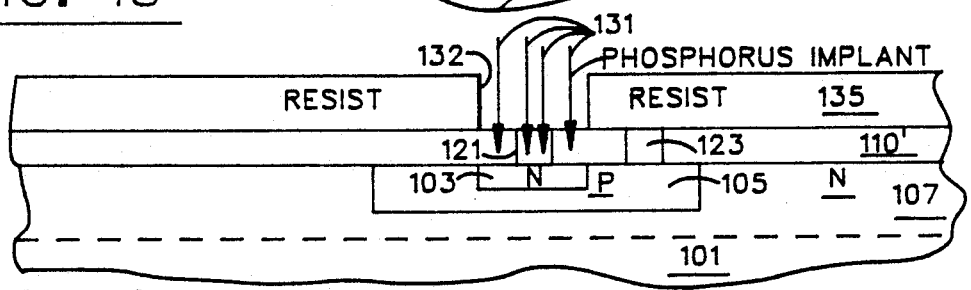
FIG. 19 shows this region opened and phosphorus implant taking place to dope the polysilicon collector electrode.
Figure 20:
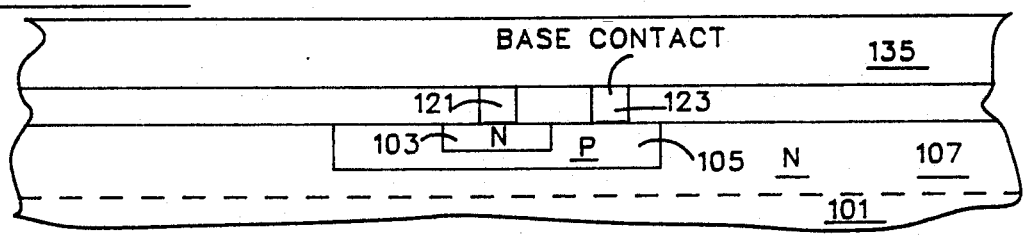
FIG. 20 shows a layer of metal applied over these two electrodes.
Figure 21:
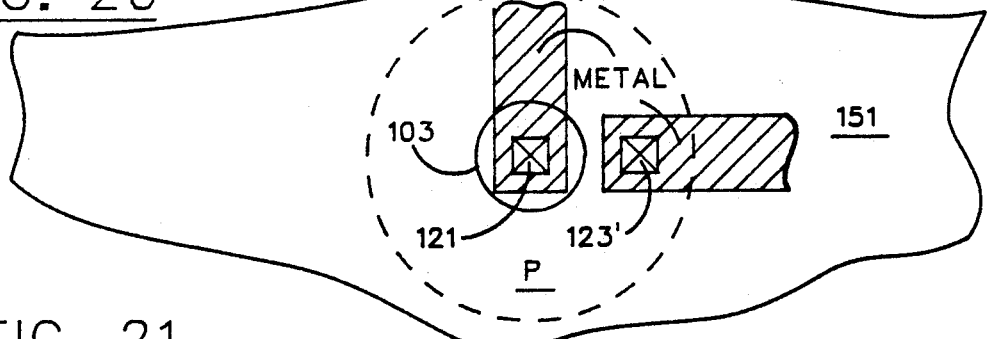
FIG. 21 shows a metal contact mask.

The next step is to mask the P contact region by employing mask 125' with opening, 126 as shown in FIG. 16. Thus, the photoresist 127 is opened in the aperture 127' and boron ions are implanted, as shown by the arrows 131 using a 60 Kev implanter with a dose of 1 to $5 \times 10^{15}$ ions per cm$^2$. Thereafter, the resist 127 is stripped and the mask of FIG. 18 is employed in similar manner to implant phosphorus ions, shown by the arrows 131 into the N contact region represented by the aperture 132 produced by the aperture 133 in mask 134 of FIG. 18. To implant this N+ contact, a dose of 1 to $5 \times 10^{15}$ ions per square centimeter is preferred. Thereafter, the resist 135 is stripped and the implants are annealed at 800° C. for 40 minutes in nitrogen.

Figure 22:
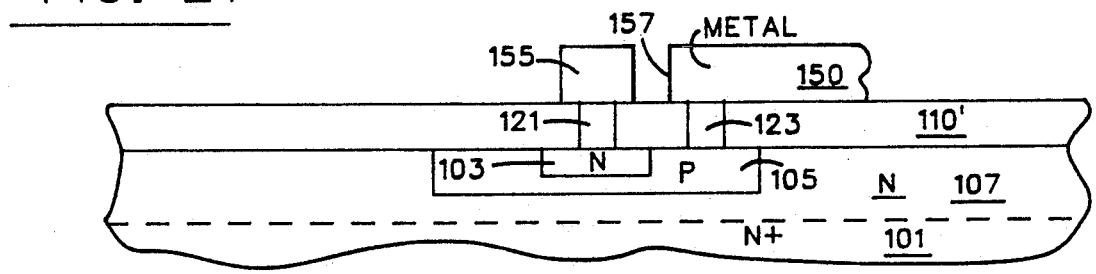
FIG. 22 shows the completed device with the metal interconnects for the two contacts.

The next step is to deposit metal, interconnect 150, FIG. 22 represents this layer of metal which is covered with photoresist and exposed through the mask 151 for etching to leave the emitter contact 155 and base contact 157 on the polyoxide layer 110' and in contact with the emitter electrode 121 and the base electrode 123, respectively. Following stripping of the resist, the device is sintered for a completed product.

The actual contact regions are shown by the squares marked 121' and 123', visible in the mask 151. These contact regions may be of the order of 0.1 by 0.1 microns per contact.

Figure 23:
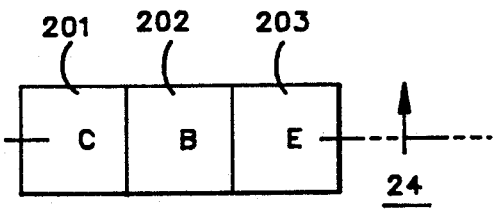
FIG. 23 is a view in top plan of a bipolar device of the Soclof type.

In FIG. 23, a plan view of a Soclof bipolar transistor is shown, as described in U.S. Pat. No. 4,415,371, METHOD OF MAKING SUB-MICRON DIMENSIONED NPN LATERAL TRANSISTOR, Nov. 15, 1983, U.S. Pat. No. 4,437,226, PROCESS FOR PRODUCING NPN TYPE LATERAL TRANSISTOR WITH MINIMAL SUBSTRATE OPERATION INTERFERENCE, Mar. 20, 1984, U.S. Pat. No. 4,522,682, METHOD FOR PRODUCING PNP TYPE LATERAL TRANSISTOR SEPARATED FROM SUBSTRATE BY O.D.E. FOR MINIMAL INTERFERENCE THEREFROM, Jun. 11, 1985, U.S. Pat. No. 4,580,331, PNP-TYPE LATERAL TRANSISTOR WITH MINIMAL SUBSTRATE OPERATION INTERFERENCE AND METHOD FOR PRODUCING SAME, Apr. 8, 1986.

In these transistors the collector, base, and emitter 201, 202 and 203 comprise substantially the transistor, there being field oxide 204 about each device.

Figure 24:
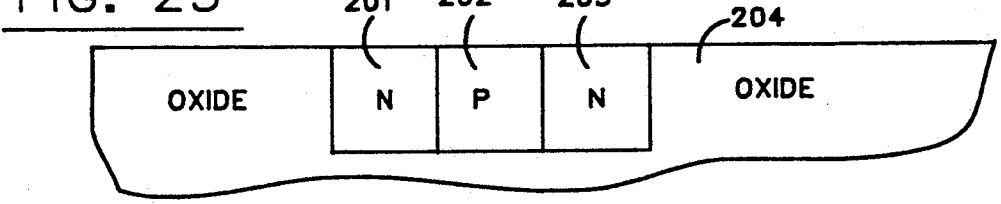
FIG. 24 shows the device of FIG. 23 in cross-section in field oxide.

In FIG. 24, the collector is shown as being N doped, the base P doped, and the emitter N doped.

The bipolar transistors may be manufactured to the stage shown in FIG. 24, in accordance with the process of any one of the Soclof patents.

The first step in building sub-micron contacts for these devices is to deposit undoped polysilicon to approximately 2000 angstroms. This layer is shown at 205 and, again, if the contacts are to be larger more polysilicon can be used.

Figure 25:
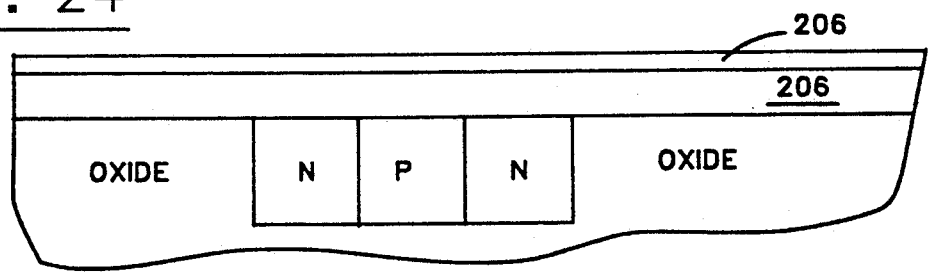
FIG. 25 shows the application of a polysilicon layer covered by a nitride layer to the structure of FIG. 24.

A layer 206 of nitride is deposited to a thickness of approximately 1000 angstroms, as thus shown in FIG. 25.

Figure 26:
FIG. 26 shows a contact mask.
Figure 27:
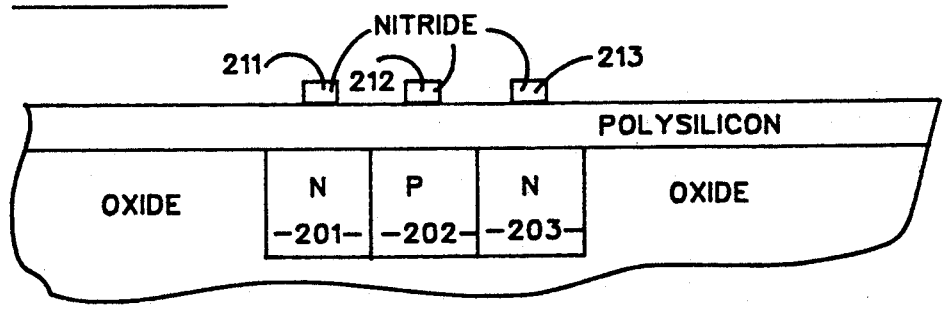
FIG. 27 shows the nitride buttons remaining over each of the bipolar elements atop the polysilicon layer.

The mask 207 of FIG. 26 is employed with photoresist (not shown) to delineate the nitride 206, thereby leaving the nitride buttons 211, 212 and 213 over the collector 201, base 202 and emitter 203 respectively.

It is important to note that during the etch removal of the nitride, a portion of the polysilicon is also removed. This may comprise one half of the polysilicon so that 1000 angstroms of polysilicon is really used for 0.1 micron contacts. The nitride and polysilicon are removed by anisotropic etch over a predetermined conventional time period.

Figure 28:
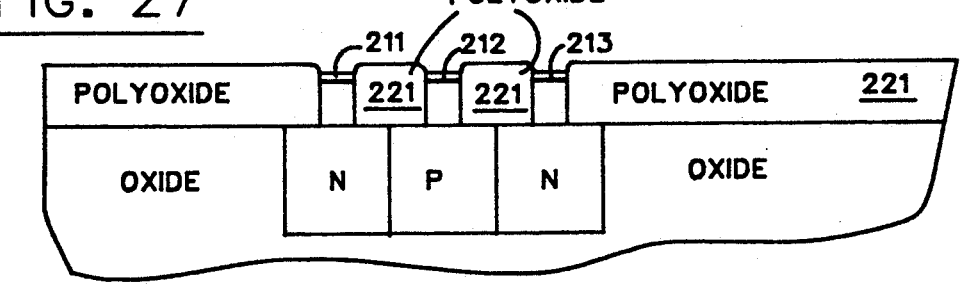
FIG. 28 shows the polysilicon layer converted to polyoxide except where the nitride buttons preserve the polysilicon.

Next, the resist is stripped and the polysilicon oxidized to become polyoxide 221, shown in FIG. 28. The polyoxide 221 also fills in the spaces between the nitride buttons 211, 212 and 213 to insulate the contacts from each other.

Figure 29:
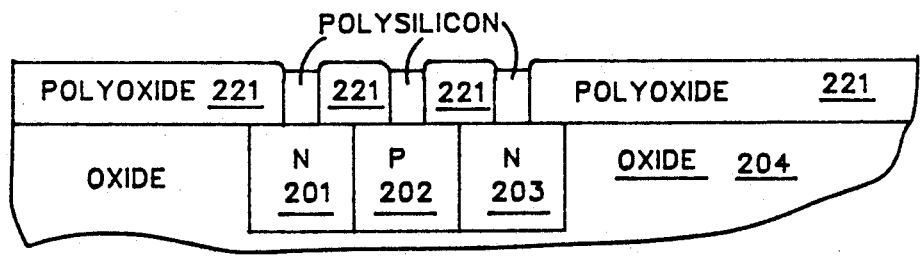
FIG. 29 shows the structure after removal of the nitride buttons.

FIG. 29 shows the structure after the nitride buttons 211, 212 and 213 have been removed by etching or stripping.

Figure 30:
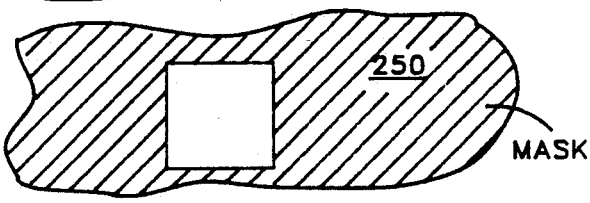
FIG. 30 shows the mask for activating the base electrode polysilicon.
Figure 31:
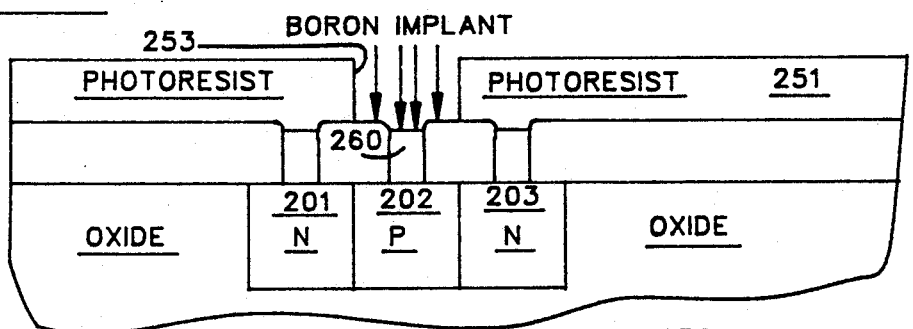
FIG. 31 shows the boron implant to achieve the doping of the polysilicon electrode.
Figure 32:
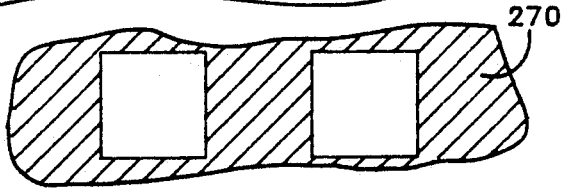
FIG. 32 shows a mask for opening regions to the collector and emitter (N regions)

In FIG. 30, mask 250 is used, together with photoresist 251 to open aperture 253 into the P doped base 202. For boron implanting into the base electrode 260 to make contact to base 202, implanting is carried out using a 60 Kev implanter with a 1 to $5 \times 10^{15}$ ions per cm$^2$ dose.

Figure 33:
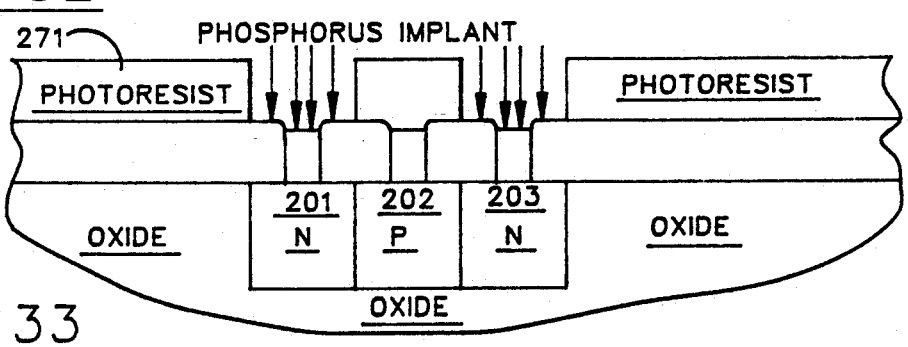
FIG. 33 shows these regions opened and the polysilicon therein being doped by phosphorus implant.

Next, the photoresist 251 is stripped and a new layer applied for use with the mask 270 to open the new layer of photoresist 271 above the collector 201, and emitter 203. The phosphorus ions are implanted, the photoresist 271 is stripped and the device of FIG. 33 is annealed for the implants at 800° C. for 40 minutes in a nitrogen atmosphere.

Figure 34:
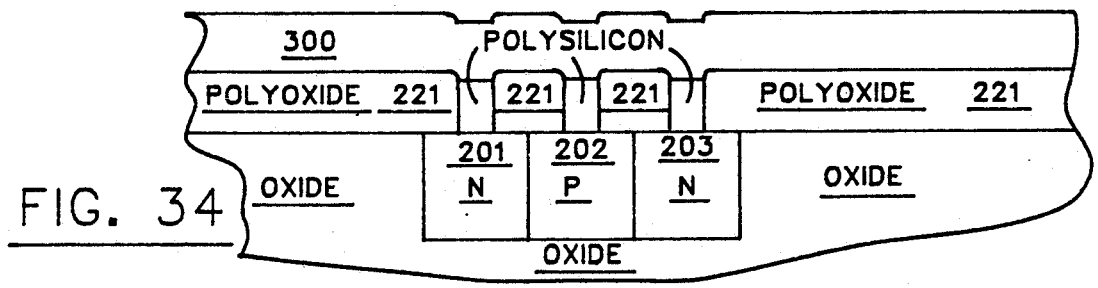
FIG. 34 shows the nitride buttons removed and the layer of metal over top of the structure.
Figure 35:
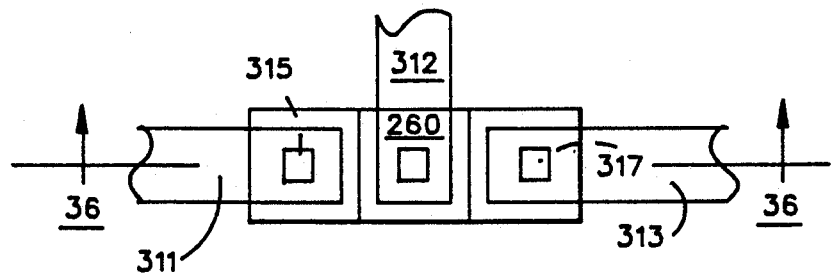
FIG. 35 shows the arrangement in top plan view as delineated by the mask of FIG. 36.
Figure 36:
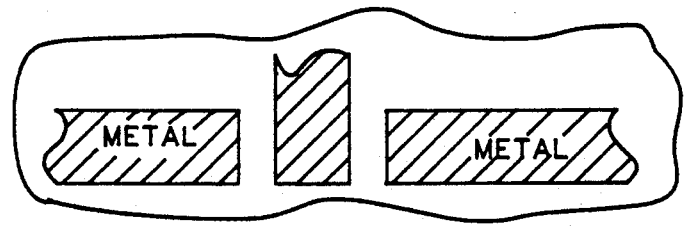
FIG. 36 shows the mask of FIG. 35.
Figure 37:
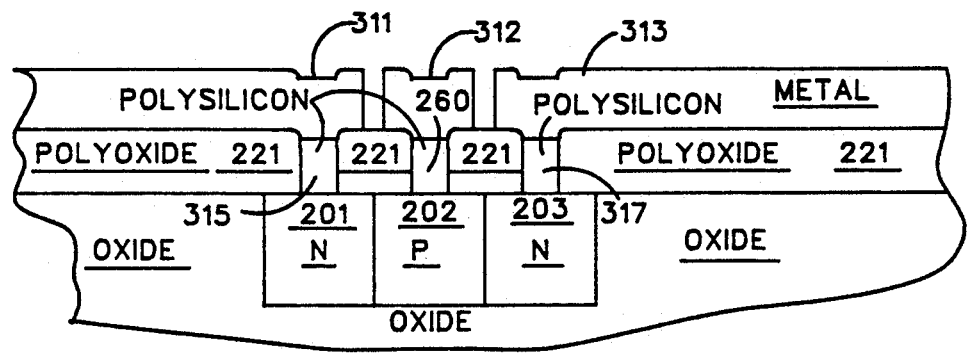
FIG. 37 shows the completed device following sintering.

In FIG. 34, a metal layer 300 has been applied over the structure, photoresist and the mask are applied and the metal is etched to provide a metal interconnect 311 (FIG. 35) to the collector 201, interconnect 312 to the base 202 and interconnect 313 to the emitter 203.

Figure 38:
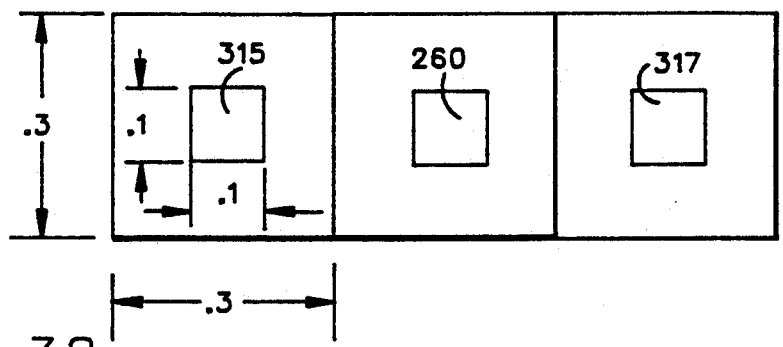
FIG. 38 shows dimensions achievable in the contact regions for these devices.

FIG. 38 shows relative sizes for the bipolar device, the elements themselves, such as the collector measuring 0.3 by 0.3 microns and the contact regions measuring 0.1 by 0.1 microns. The contacts can be oversized to approximately 0.3 microns and the elements may measure 0.9×0.9 microns. Of course, the principles disclosed permit 3 and 4 micron devices with (e.g.) 0.9~1.0 plus micron contacts if desired.

The use of an E-beam fabricator, guided by the masks successively used herein, makes the VLSI contacts of the order of these smaller dimensions. Of course, much larger contacts might be readily utilized on the larger devices. This technique is accomplished through the use of polysilicon which remains in the electrode areas, but is converted to polyoxide in the remaining areas with the nitride buttons guarding against oxidation of the polysilicon electrode areas.

If desired, single MOS or bipolar devices may be made, and it is only necessary to insulate them by isolation, usually in lieu of the field oxide, illustrated.

It should now be appreciated that the present invention provides the most minimal size Soclof type (totally lateral) bipolar devices attainable because they consist primarily of active elements. For the MOS and conventional bipolar, minimal size contacts are also obtained down to 0.1×0.1 microns, or to 0.1 micron diameter where the spot size is 0.1 micron or less.

Figure 39:
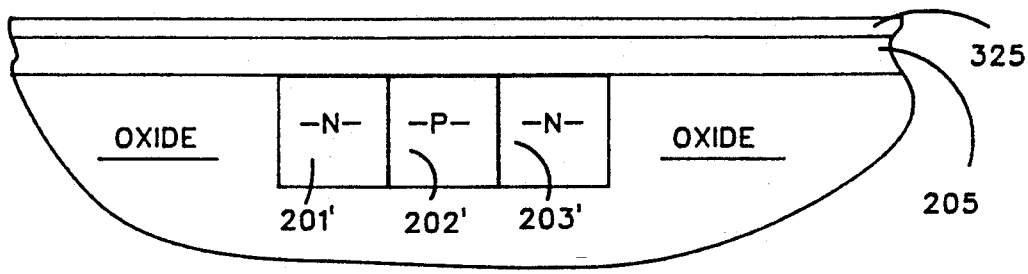
FIG. 39 shows the NPN elements of a transistor being formed embedded in oxide and covered by a layer of polysilicon, in turn covered by a layer of nitride.
Figure 40:
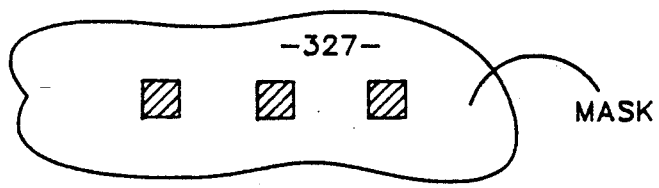
FIG. 40 is a contact mask.
Figure 41:
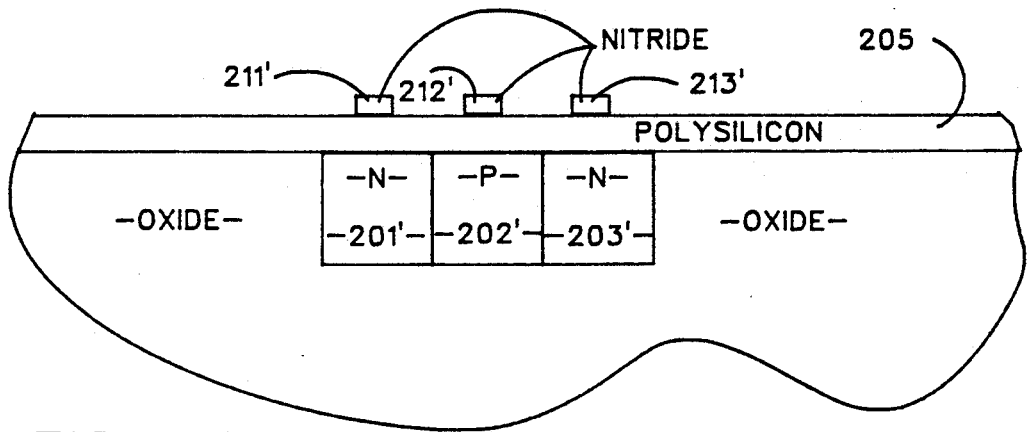
FIG. 41 shows the nitride contact buttons.

Yet another alternative method for forming the 0.1 to 0.9 micron contacts is disclosed, beginning with FIG. 39 wherein the three elements, collector 201', base 202' and emitter 203' are first covered by polysilicon 205' to a depth of, e.g., approximately 3000 angstroms, and nitride 325 is deposited to a depth of, e.g., approximately 1000 angstroms. Mask 327 (FIG. 40) serves to form the nitride buttons 211', 212' and 213' (the same as before). These nitride buttons 211'-213' are preferably centered over the collector 201', base 202' and emitter 203', as seen in FIG. 41, although considerable leeway is available for any misalignment, as is apparent from dimensional FIG. 53. The contacts of any of the previous embodiments may also be formed by this process.

Figure 42:
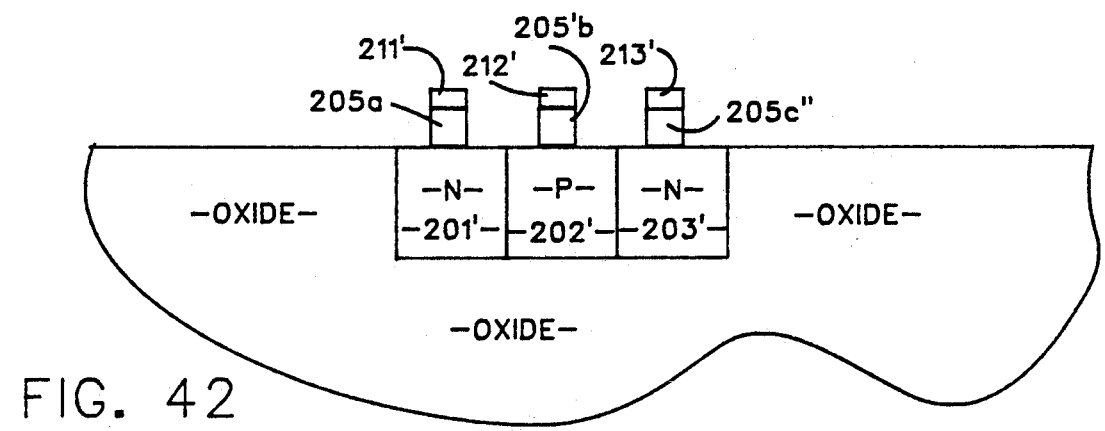
FIG. 42 depicts the isolated polysilicon contacts.

In FIG. 42, the unprotected polysilicon 205' has been removed in conventional manner, such as by etching to leave undoped polysilicon contacts 205a, 205b', and 205c''.

Figure 43:
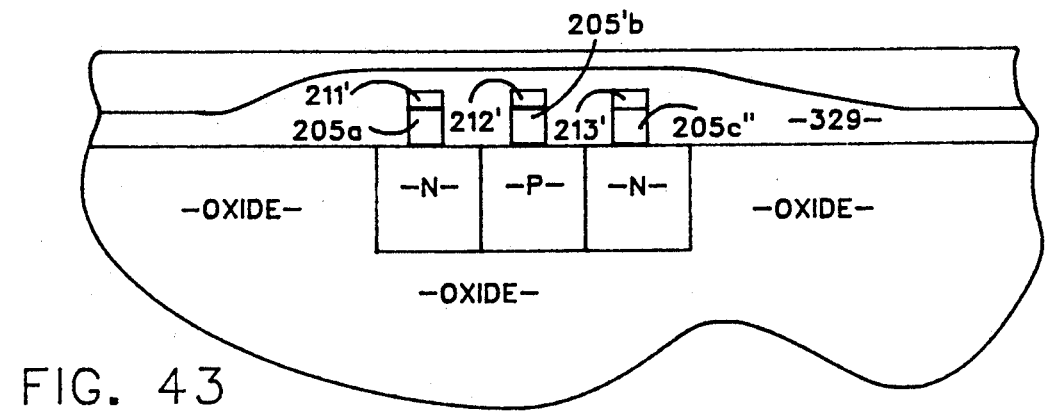
FIG. 43 reveals the plasma oxide covering the contacts, and in turn covered by glass (SOG)

In FIG. 43, plasma oxide 329 is deposited using the conventional planarization process to a depth of approximately 3000 angstroms. This step is followed by spin on glass 327 (SOG) so as to look substantially planar. Note here, layers 329 and 327 are both oxide compounds, but are never oxidized in this process.

Figure 44:
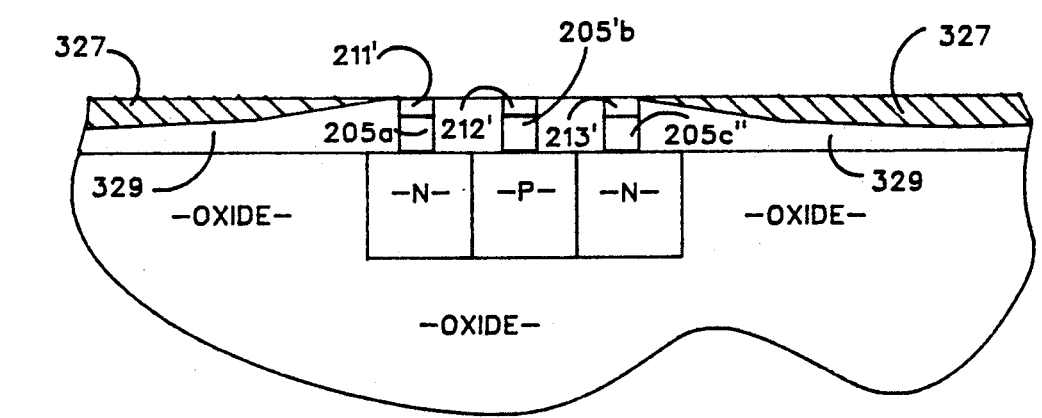
FIG. 44 planarizes the structure of FIG. 43 down to the tops of the nitride buttons.

In FIG. 44, a reactive ion etching (RIE) conventional step is carried out for effecting planarization which exposes the nitride buttons 211', 212' and 213' and is terminated approximately at the level of the tops of these buttons.

Figure 45:
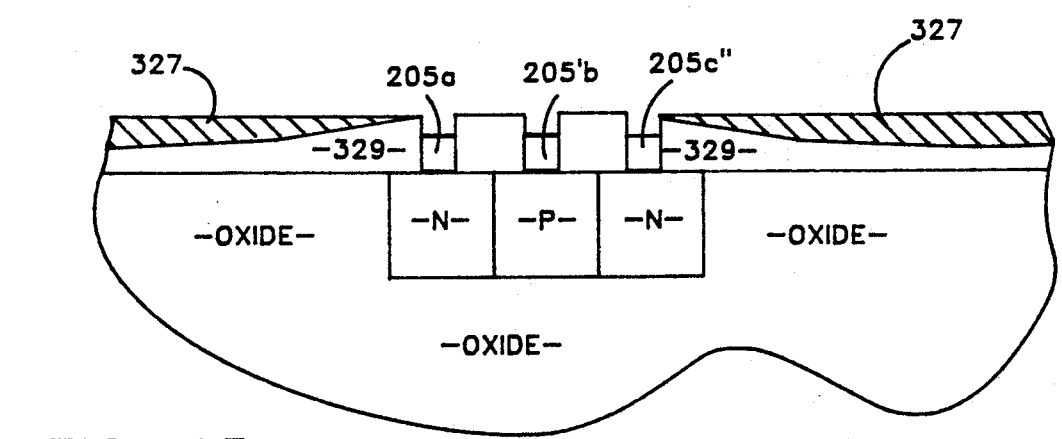
FIG. 45 shows the structure of FIG. 44 with the nitride buttons removed.

In FIG. 45, the nitride buttons 211', 212' and 213'' have been removed from the contacts 205a, 205'b and 205''c using a conventional step to prepare the contacts for doping to make them properly conductive.

Figure 46:
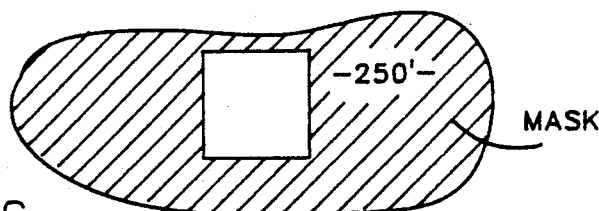
FIG. 46 shows the mask to be used in making a doping opening to the base contact.
Figure 47:
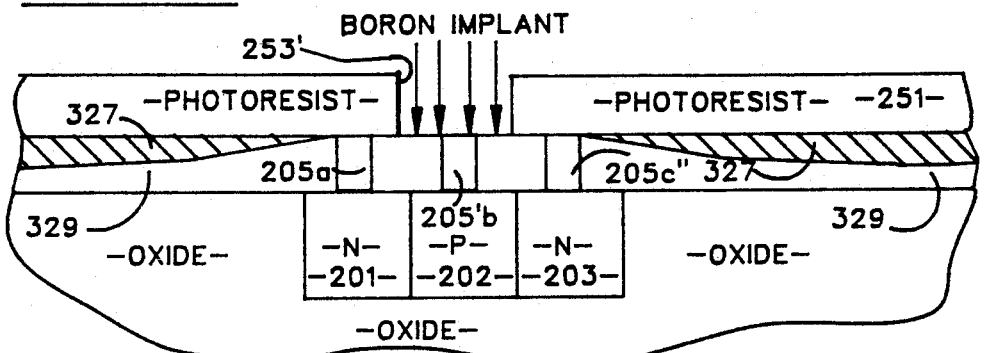
FIG. 47 shows the doping step for the base contact.

In FIG. 46, mask 250' is shown for delineating photoresist 251', in the previous manner, to provide the opening 253' for the boron implant, as shown by the arrows in FIG. 47.

Figure 47A:
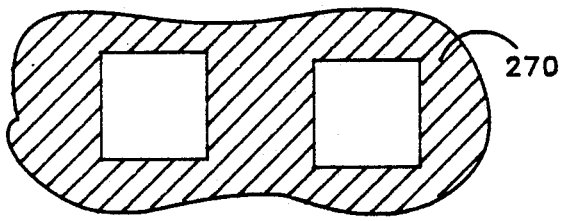
FIG. 47A shows a mask for making openings to the collector and emitter contacts.
Figure 48:
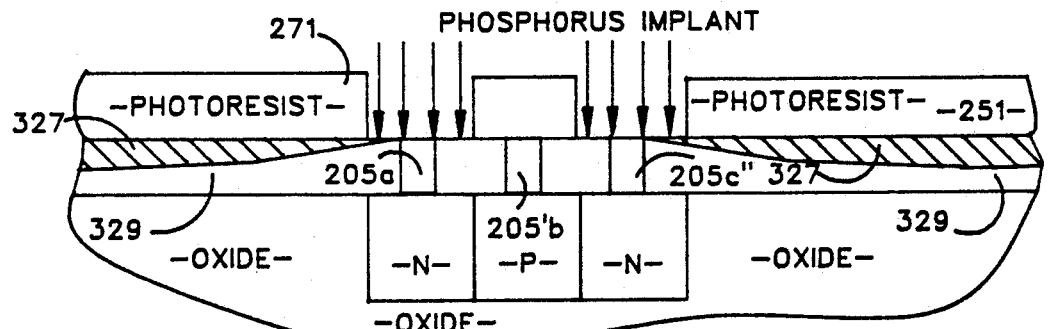
FIG. 48 shows the doping step for the collector and emitter contacts.

In similar fashion, mask 270' of FIG. 47A, is again utilized to delineate the photoresist 271 for the phosphorus implants, shown by the arrows (FIG. 48), thereby concluding the doping of the three polysilicon contacts 205, 205' and 205'' in the same N or P doping as their underlying collector, base and emitter.

Figure 49:
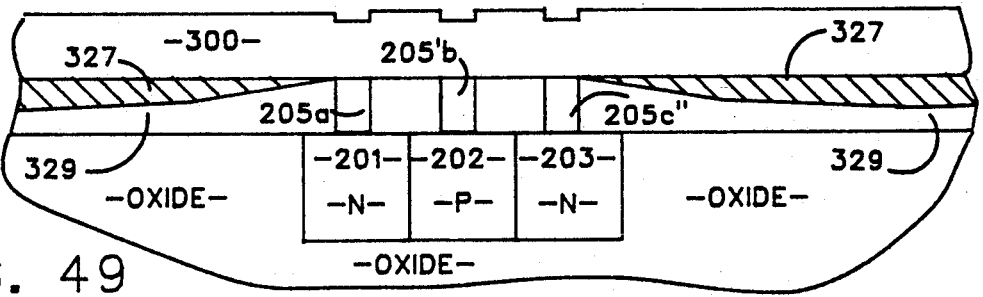
FIG. 49 includes the metal interconnect layer.
Figure 50:
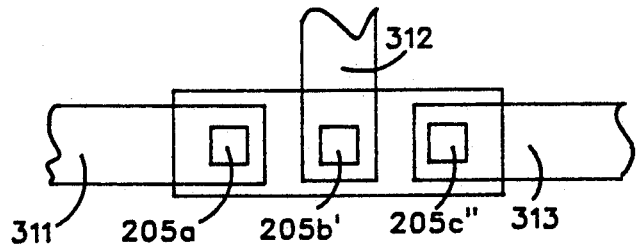
FIG. 50 shows the delineated metal interconnects.
Figure 51:
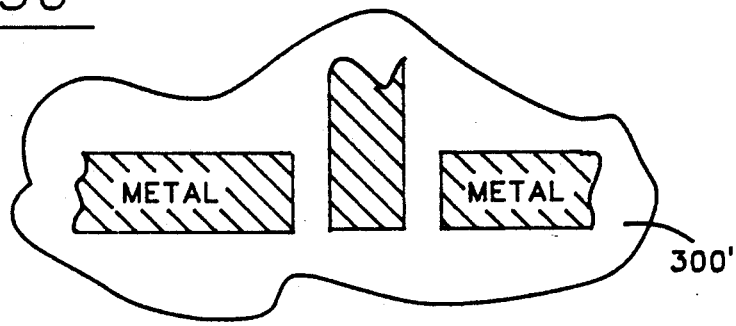
FIG. 51 shows the mask for effecting the delineation.

In FIG. 49, the metal layer 300 has been applied over this structure, and the metal mask of FIG. 51, shown at 300', is used, and the metal is etched to provide the metal interconnects 311 (FIG. 50, to the doped poly electrode 205a of collector 201, interconnect 312 to the doped poly electrode 205'b of the base 202 and interconnect 313 to the doped poly electrode 205''c of emitter 203.

Figure 52:
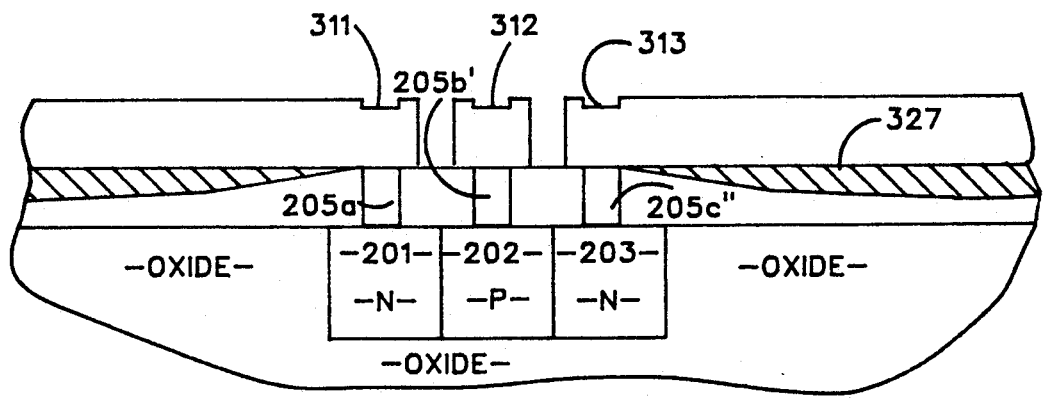
FIG. 52 shows the completed device.

FIG. 52 shows the completed device made in this fashion.

Figure 53:
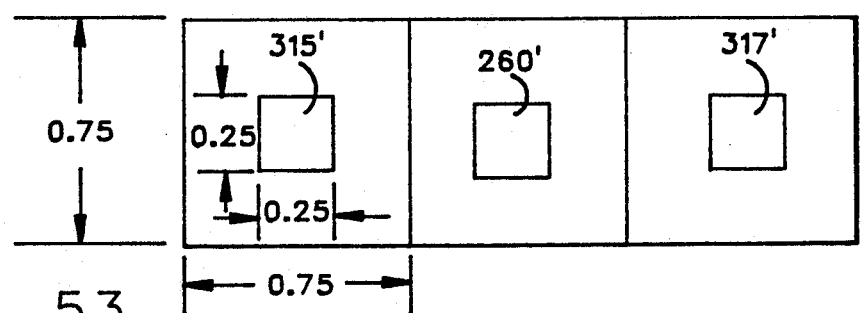
FIG. 53 is an example of relative sizes available from this method.

Finally, FIG. 53 shows, by way of example, relative sizes for the bipolar device, the elements themselves such as the collector measuring 0.75 by 0.75 microns and the contact regions measuring 0.25 by 0.25 microns. Of course, the effective dimensions of FIG. 38 may be achieved with this process, as well as dimensions of 3 to 4 micron devices.

The use of an E-beam fabricator, guided by the masks successively used herein, makes the VLSI contacts of the order of these dimensions. Of course, larger contacts might be readily utilized. This technique is accomplished through the use of polysilicon which remains in the electrode areas, but is surrounded by insulation in the remaining areas with the nitride buttons having guarded against destruction of the polysilicon electrode areas.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1×0.1 microns, or to 0.1 micron diameter where the spot size is 0.1 micron or less. The method also encompasses larger sizes even into 1 or 2 or more microns.

The principles of the present invention are compatible with use of 1:1 printer equipment for, e.g., 2 micron dimensions, the 10:1 stepper for, e.g., 1 micron rated dimensions, and electron beam or X-ray lithography for under 1 micron dimensions, all utilizing accepted existing registration and alignment techniques.

Conversely any irregularities in contact size where oxidation is involved can be compensated by adequate oversizing so as to render the final dimensions within target. For example, if birdsbeak were to consume 70% of silicon thickness, then to convert 2000 angstroms of polysilicon thickness to polyoxide, oversizing of the contact by approximately 0.14 micron on each side would be necessary to end up with 0.1 micron contact size after oxidation. This is achieved by use of a mask having 0.1+0.28 equal to 0.38×0.38 mask size; so the polysilicon left is 0.1. While this is not an exact science, compensation methodology is conventionally used in the industry.

One reason for developing contacts of the order of 0.1 microns is to enable a minute device to be produced (i.e.) the overall structure may measure 0.3 emitter width, plus 0.3 base width, plus 0.3 collector width—each 0.3 long with no waste spaces (i.e.) totally active device. In such a device, a contact on each element of the order of 0.1 micron leaves a spacing of 0.1 micron on all sides of the contact within the element—a layout now achievable. Particularly, in the military and in space carried packages, a real estate savings of this magnitude is highly desirable. Use of the polysilicon—low temperature oxide—SOG process readily admits of such unique dimensioning. (E-beam spot sizes of 0.1 micron and smaller are in standard use, today and when employed in these processes, such dimensioning is realizable).

In summary, the following advantages are achieved by this invention:

1. Sub-micron contact technology.

2. Contact integrity without the need of excessive silicon content in the metal or contact barriers such as titanium nitride, etc.

3. Planar structures without severe steps to hinder metal step coverage, or restrictions for proximity of contact to vias to gates thereby improving packing density.

4. Principle applicable to MOS (NMOS, PMOS, CMOS, etc.), bipolar devices and GaAs technologies.

5. Contact technology compatible with shallow junctions and other state of the art processes such as selective silicides.

6. Minimum overlap of metal for interconnects.

7. Via overlap of contact realizable with this technique.

DESCRIPTION OF PREFERRED NMOS, PMOS AND CMOS

The conventional NMOS device of FIGS. 1-10 readily admits of the spin on glass/low temperature oxide sub-micron contact method of FIGS. 39-52 with or without the silicide extended area contacts, as will now be described using FIGS. 54 through 62.

The PMOS structure and the CMOS structure will be apparent from a reading of FIGS. 53 through 74.

Figure 54:
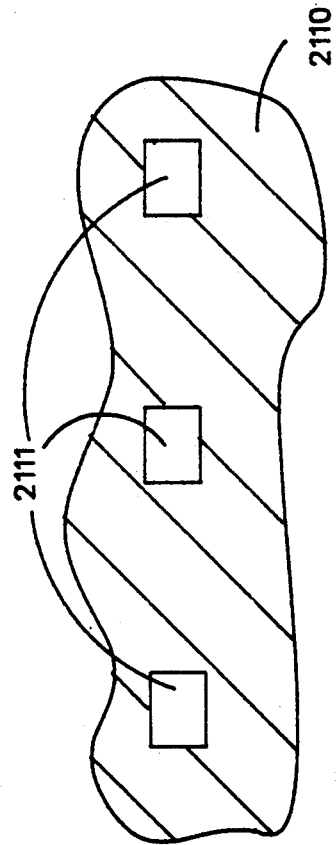
FIG. 54 is a contact mask for an NMOS transistor. This FIG. follows original FIG. 4.
Figure 55:
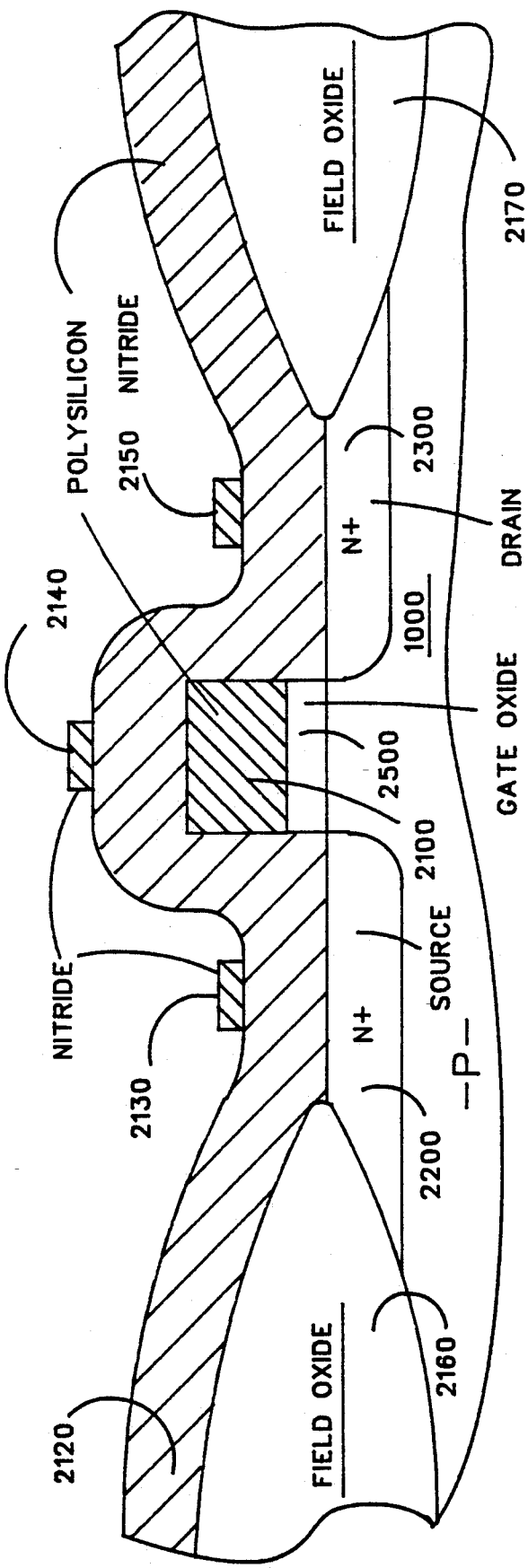
FIG. 55 is a view in cross-section of the NMOS device with nitride caps over polysilicon for the contacts.

FIGS. 54 and 55 pick up the NMOS structure starting with FIG. 3. First the thin oxide 25 is removed except for the gate oxide 20 underneath the polysilicon gate 21 of FIG. 3.

Next, in FIG. 55, a layer 2120 of polysilicon is applied to the structure to cover the field oxide 2160 and 2170, the source 2200, gate 2100, drain 2300 and wafer 1000.

A thin layer of nitride (not shown) is applied over the polysilicon 2120, and the mask 2110 of FIG. 54 is used to preserve the nitride caps 2130, 2140 and 2150 in the photolithography process detailed herein in the original application. In any event, the nitride caps are over the positions where the contacts will be formed for the source, gate and drain.

Figure 56:
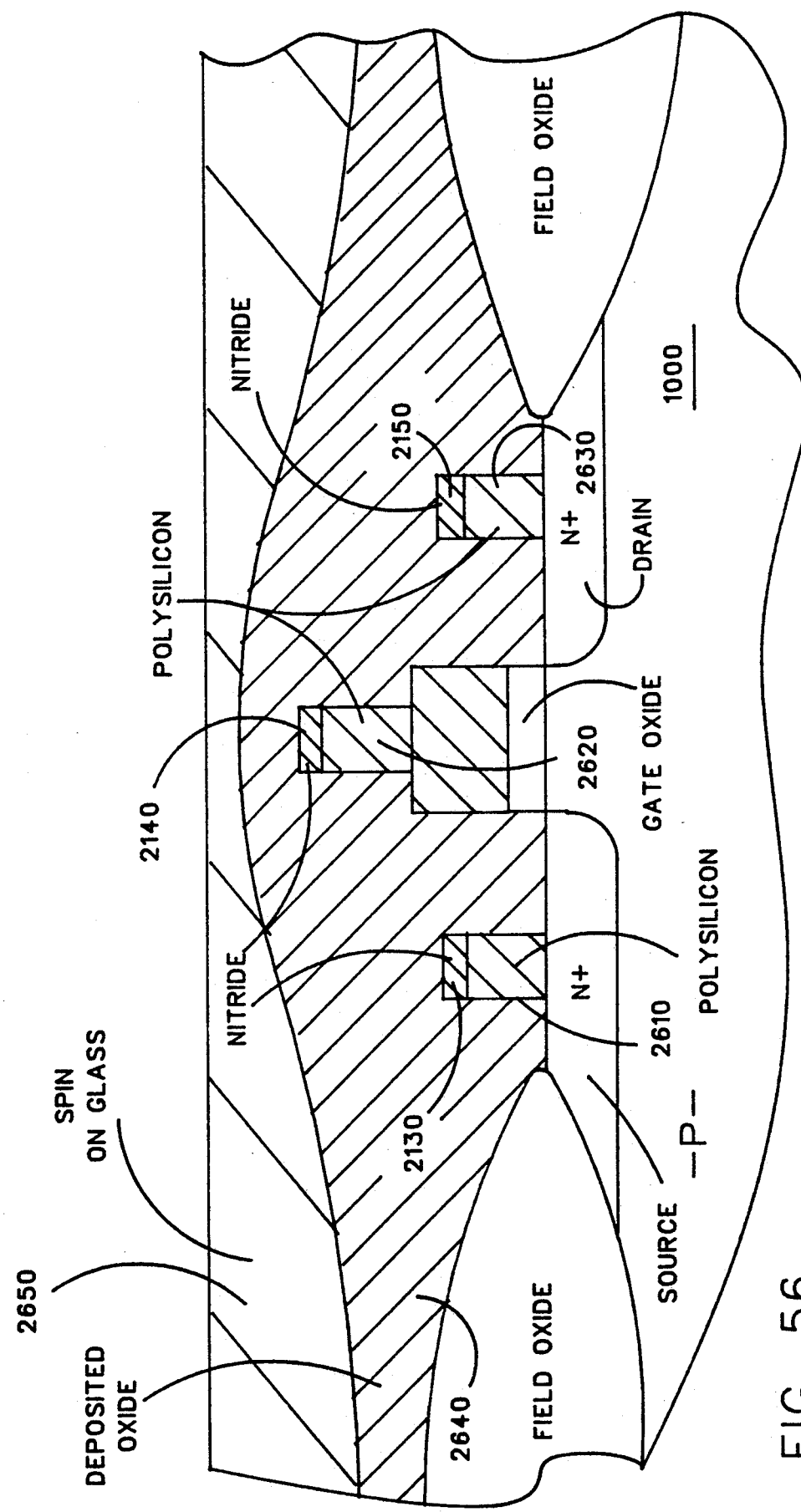
FIG. 56 shows the application of a layer of deposited oxide and a layer of spin on glass.

Next, in FIG. 56, deposited oxide 2640 is "snowed" onto wafer 1000 to cover all of the structure, including the nitride caps 2130, 2140 and 2150, after the polysilicon 2120 has been removed by etching (RIE).

Spin on glass 2650 is then flowed on to cover the entire deposited oxide 2640.

Figure 57:
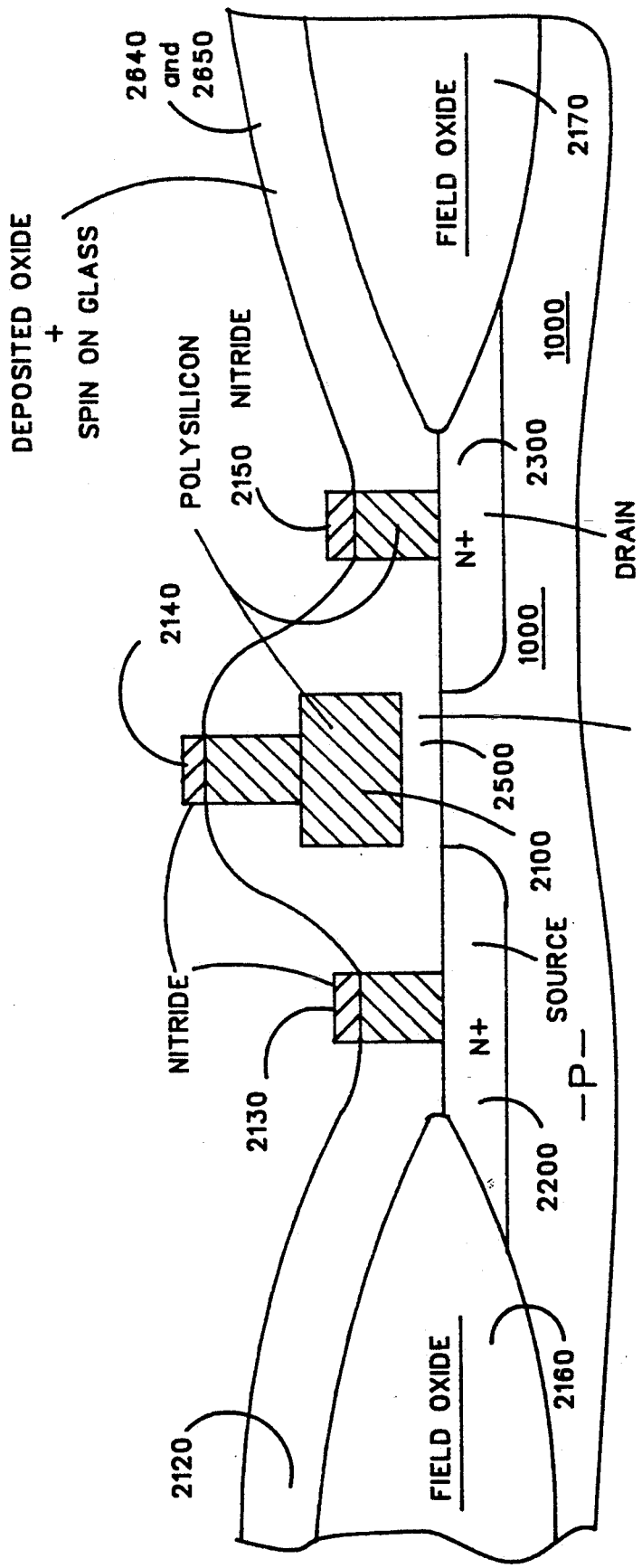
FIG. 57 shows the structure of FIG. 56 with the spin on glass layer etched below the caps on the layer of polysilicon.

In FIG. 57, the mixed spin on glass 2650 and deposited oxide 2640 are etched away to the level just below the nitride caps 2130, 2140 and 2150.

In FIG. 58, photoresist layer 2700 has been exposed through mask 2710 of FIG. 58A to open up enlarged areas over the contacts 2610, 2620 and 2630 being formed. These openings are designated 2720, 2730 and 2740. This permits implanting N-type dopant i.e. phosphorus or arsenic, shown by the arrows 2750, 2760 and 2770 to dope the contacts 2610 and 2630 the same type as the source 2200 and drain 2300 but, to also dope the gate contact 2620 and the gate 2100.

Figure 59A:
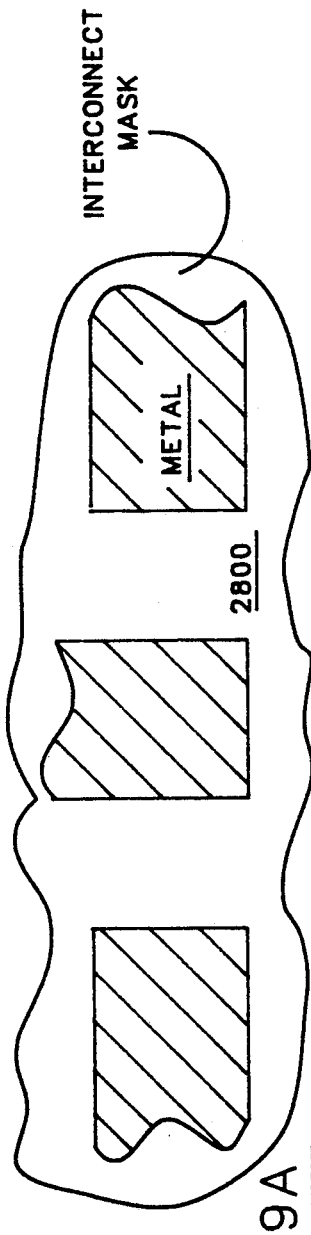
FIG. 59A shows the interconnect mask of FIG. 59.
Figure 59:
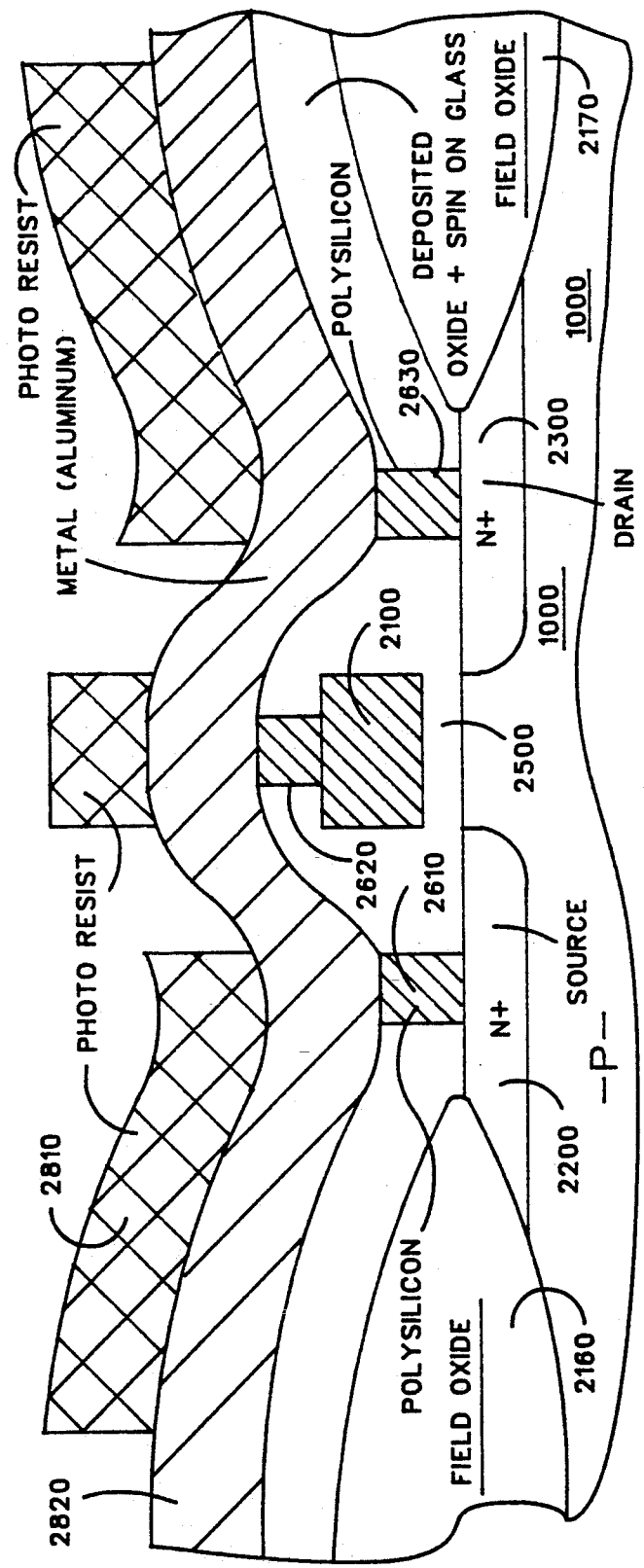
FIG. 59 depicts the patterned photoresist, as a result of interconnect on the polysilicon layer in the position of metal interconnects to be formed.

In FIG. 59A, interconnect mask 2800 is employed with conventional photolithograph to delineate the metal interconnects for the structure for FIG. 59.

Figure 60:
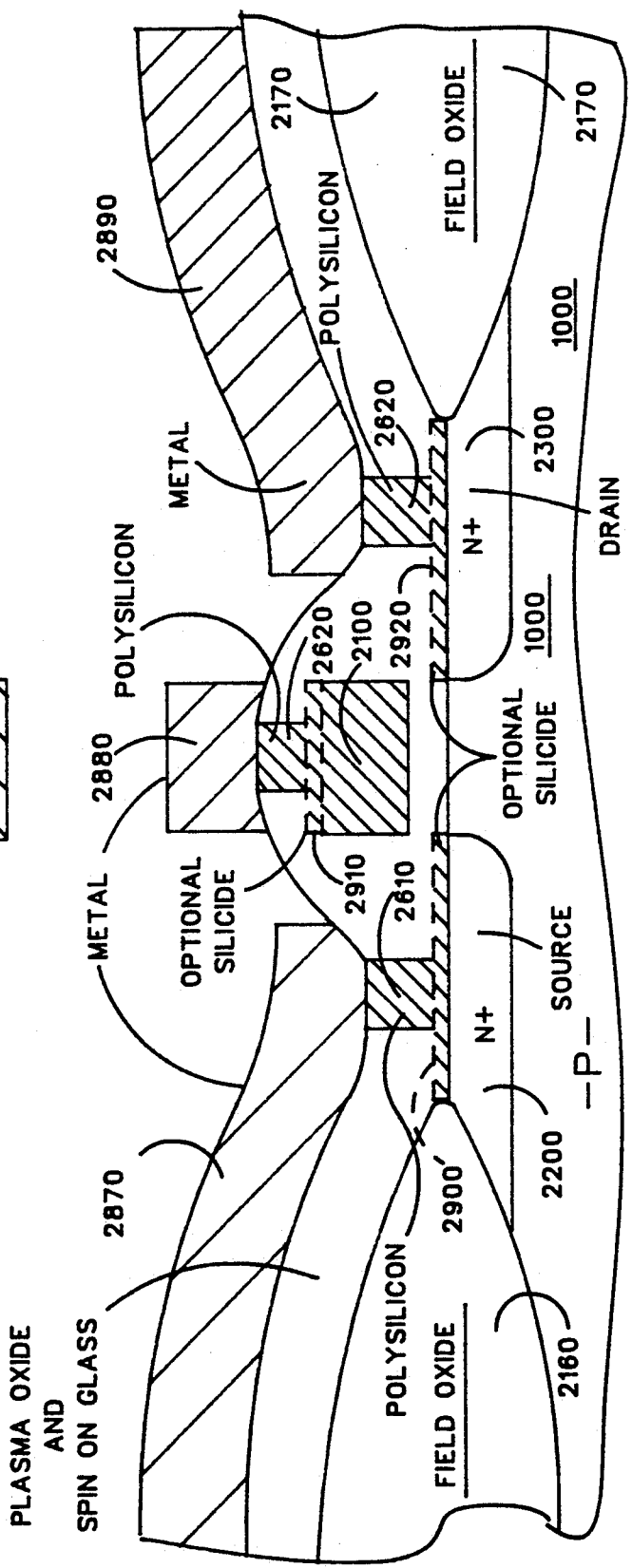
FIG. 60 shows the finished NMOS product with metal interconnects and dotted in optional silicide contact area extenders.

Photoresist 2810 is deposited according to mask 2800 on the metal (e.g. aluminum) layer 2820 and is patterned to protect the interconnects for the respective contacts from etching away of the metal, as is shown in FIG. 60.

Figure 61:
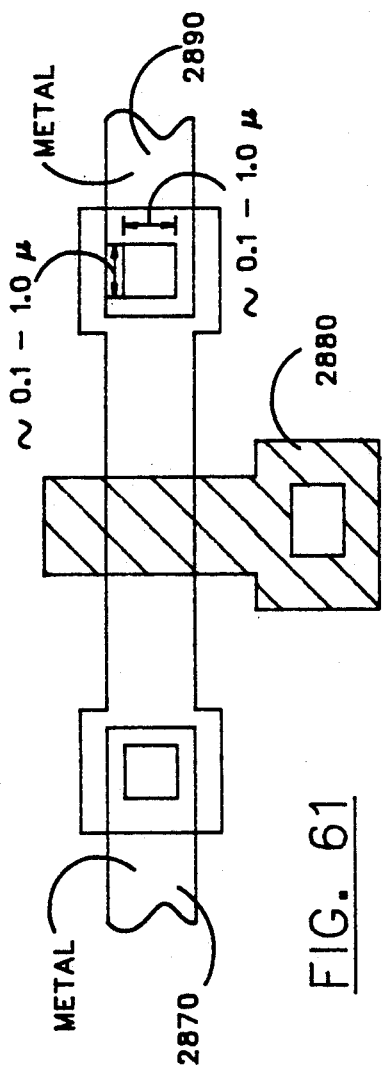
FIG. 61 is a top plan view of the NMOS devices of FIG. 60.

Thus, the metal interconnect for the source 2200 is shown at 2870 in FIG. 60 and FIG. 61, the metal interconnect for the gate 2620 is shown at 2880 in both of these FIGS. and the metal interconnect for the drain 2630 is shown at 2890 in both FIGS. 60 and 61.

This shows the completed NMOS device, but it also shows the optional silicide contact enlargement areas, such as the area 2900 over the source 2200 upon which contact 2610 is built. Similarly, silicide 2910 appears beneath gate contact 2620 but extends over gate 2100. Also, silicide 2920 is found between drain 2300 and its contact 2630.

Figure 62:
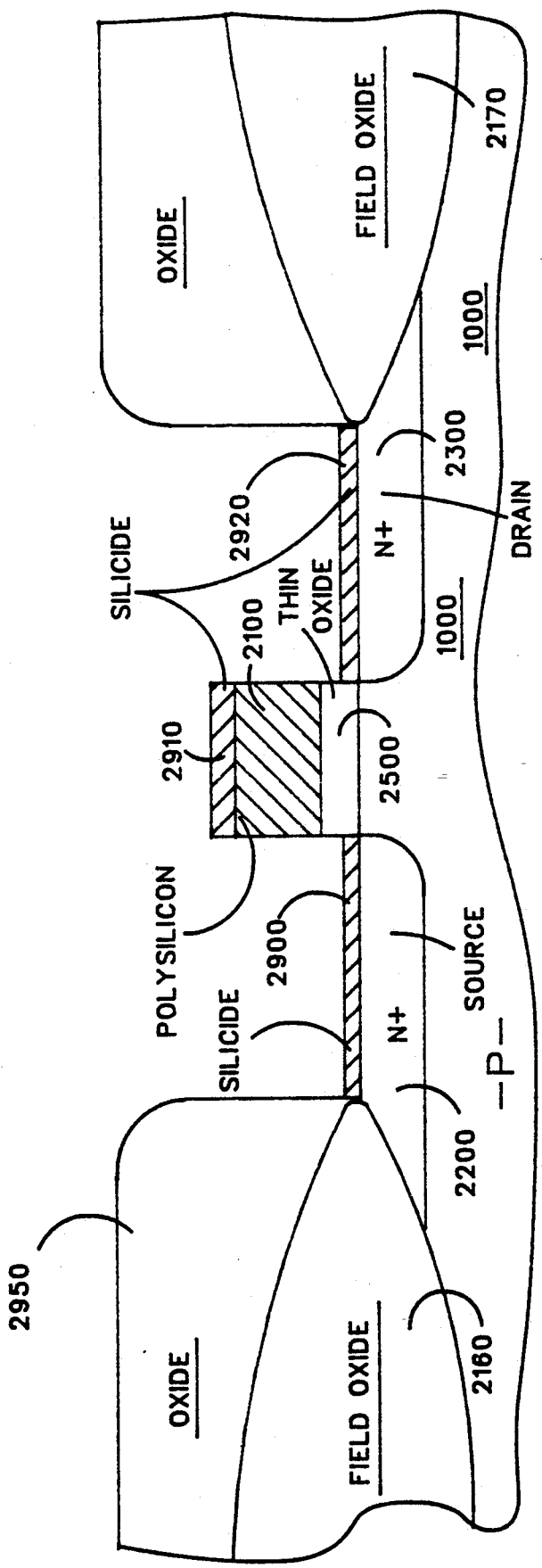
FIG. 62 shows the structure of FIG. 4 with silicide contact area extenders in place to receive source, drain and gate contacts.

FIG. 62 shows the manner of laying down the silicide 2900, 2910 and 2920 by proceeding from original FIG. 3 to eliminate the thin oxide 2500 everywhere except under the gate 2100, and then protect the field oxide 2160 (FIG. 62) and 2170 by laying down oxide 2950 so that when platinum, tungsten, or titanium or the like is layered over wafer 1000, the portions in contact with silicon or polysilicon will turn to silicide when heated in an oven at 400 to 600 degrees C. for approximately one half hour.

Figure 70:
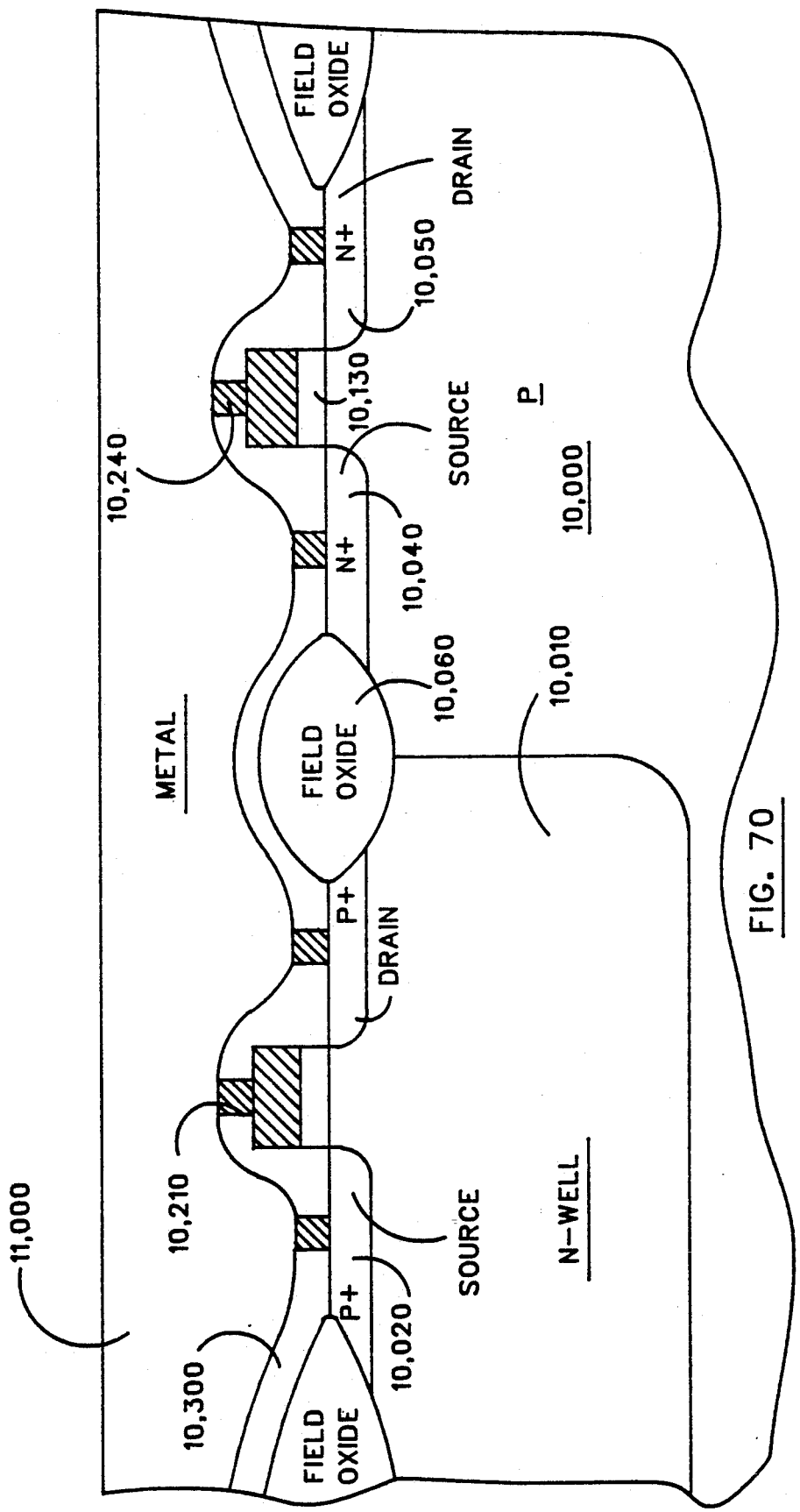
FIG. 70 shows the metal layer for metallization.
Figure 71:
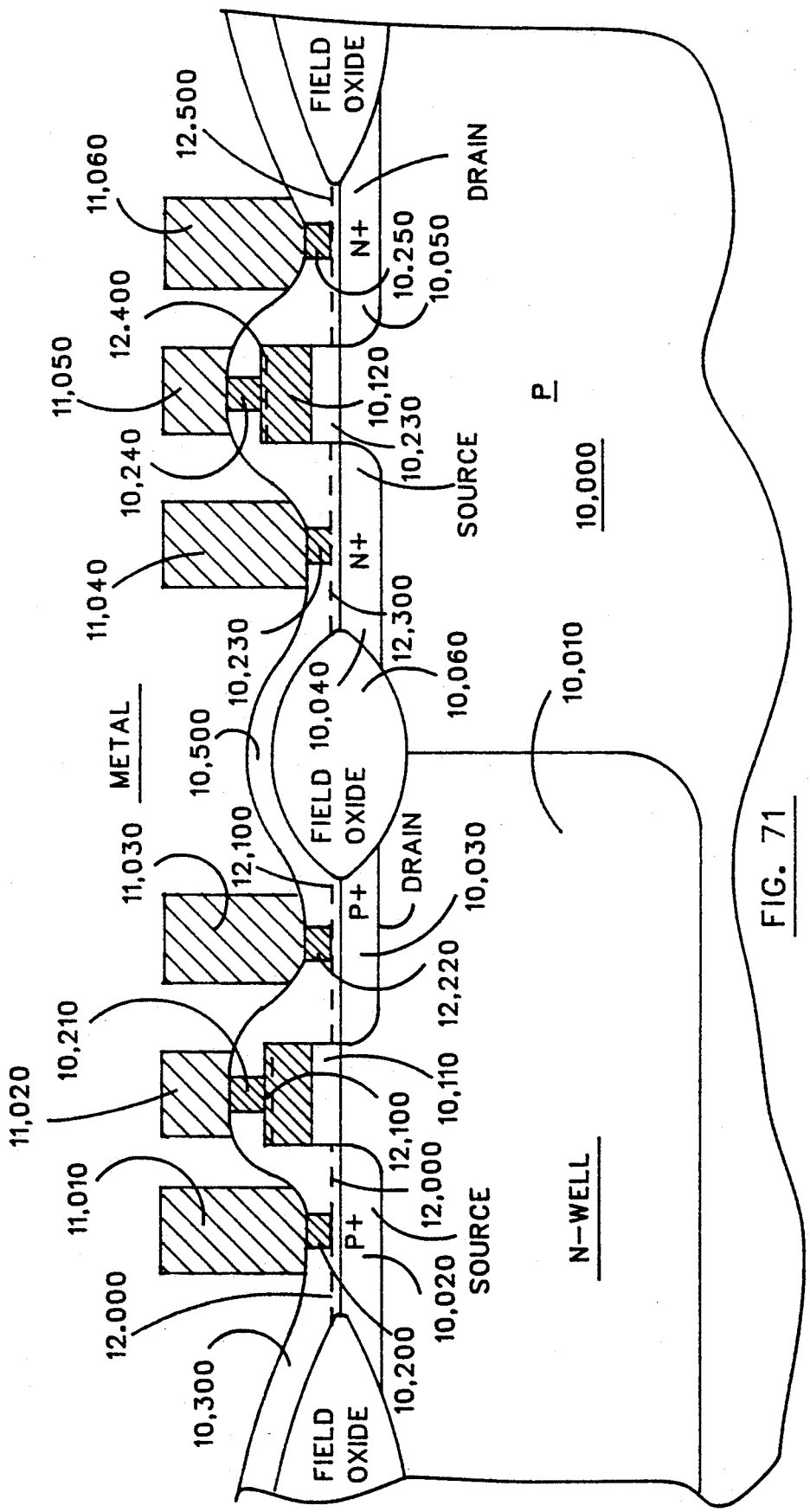
Figure 72:
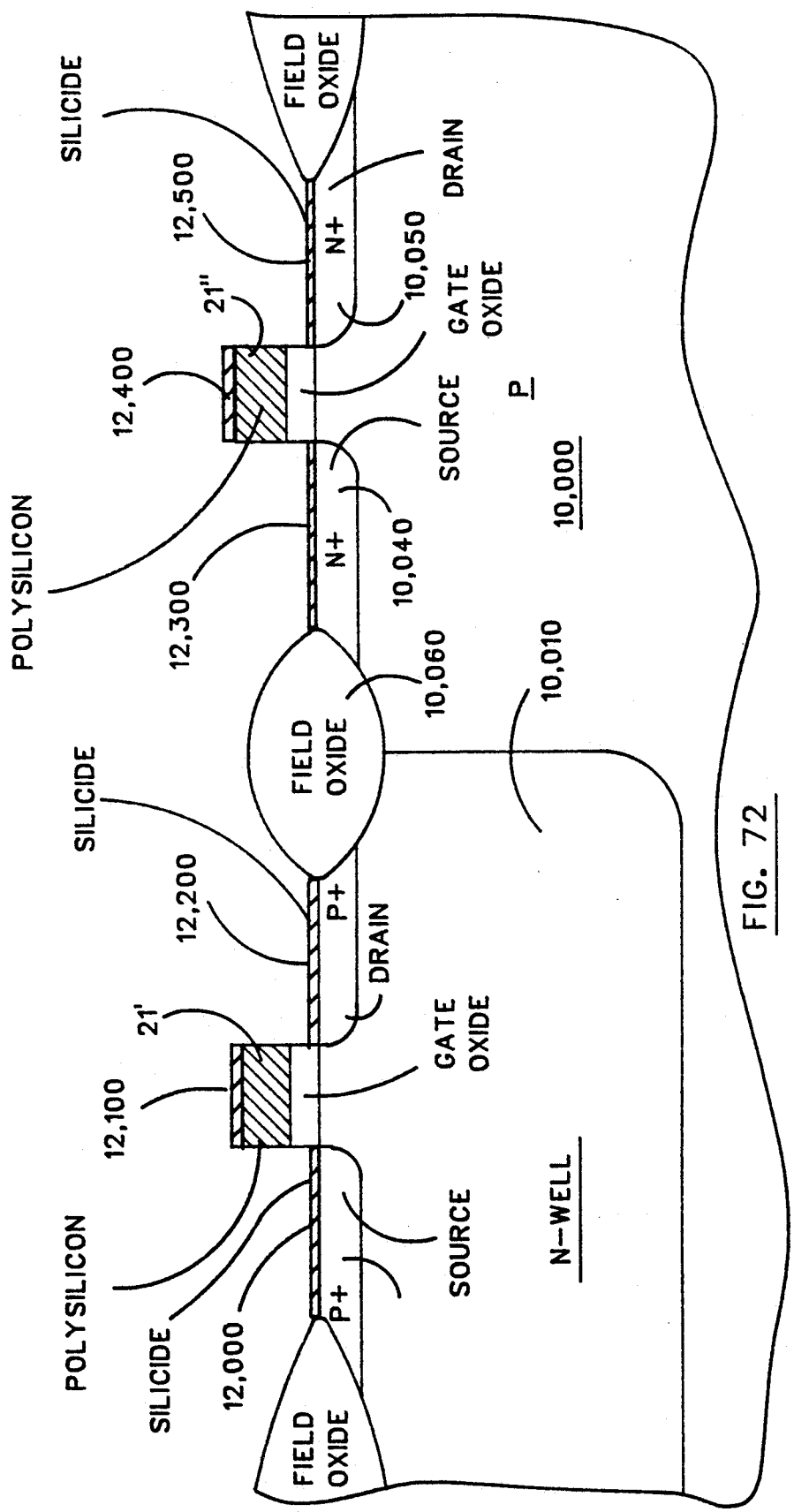
FIG. 72 shows the silicide step.

Finally, FIGS. 63 through 72 will show the construction of CMOS with the tiny contacts creatable only by utilizing the snowed on composited oxide and spin on glass with the optional silicide of FIG. 72.

Figure 63:
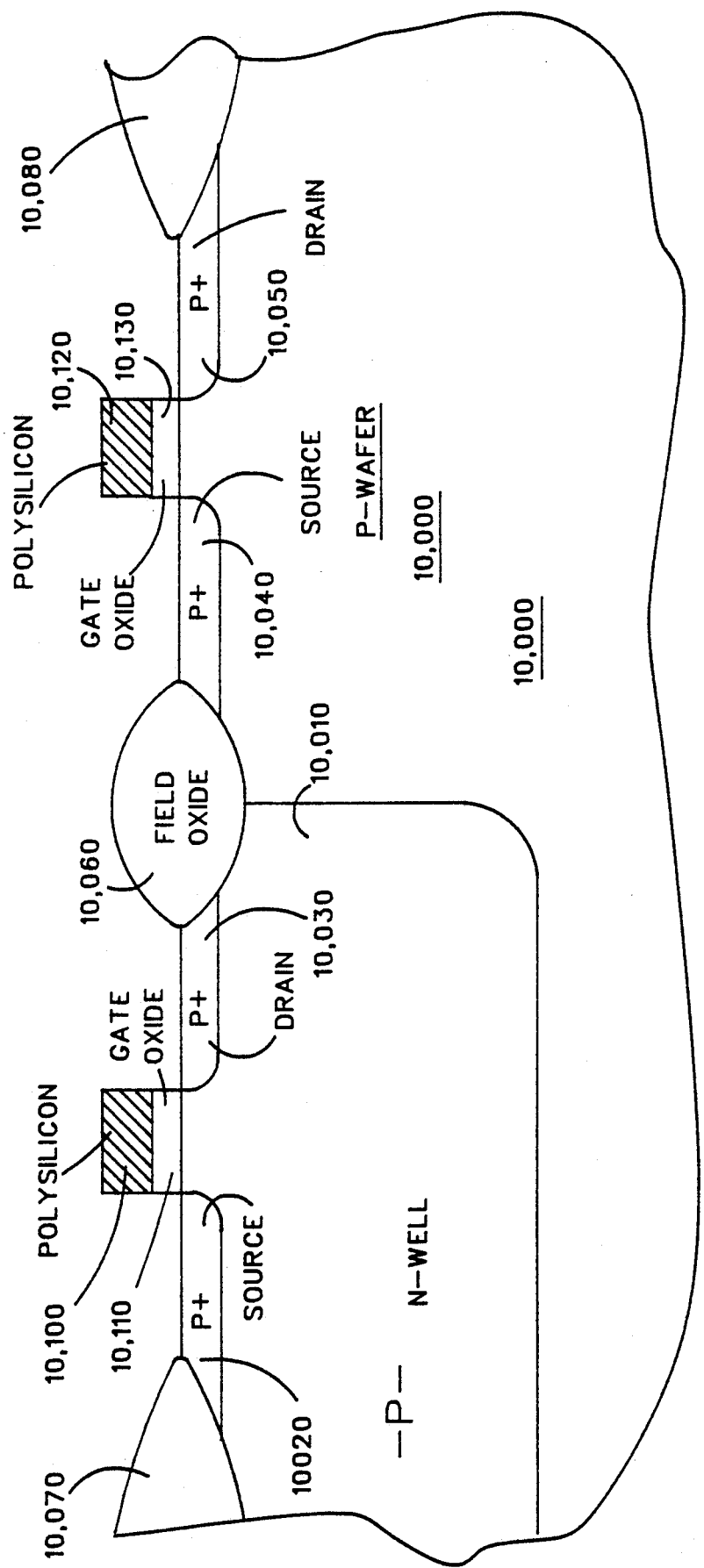
FIG. 63 follows original FIG. 4 to show CMOS construction using an N-well.

In FIG. 63, both PMOS and NMOS devices are manufactured together as CMOS in FIGS. 63 through 72, the latter adding silicide.

In FIG. 63, the P wafer is designated at 10,000 and the first step is to implant an N-well 10,010. Then, the steps of original FIGS. 1 through 3 are carried out with the only difference being that one side (PMOS) is doped P+ for the source 10,020 and for the drain 10,030, the other side (NMOS) source 10,040 being doped N+ and the other drain 10,050 being doped N+ as shown in FIG. 63.

Also, in FIG. 63, additional field oxide 10,060 has been added between the field oxide 10,070 and 10,080 to separate the PMOS from the NMOS devices. The PMOS gate 10,100 is shown over thin oxide 10,110 and the NMOS gate 10,120 is shown over its thin oxide 10,130.

Figure 64:
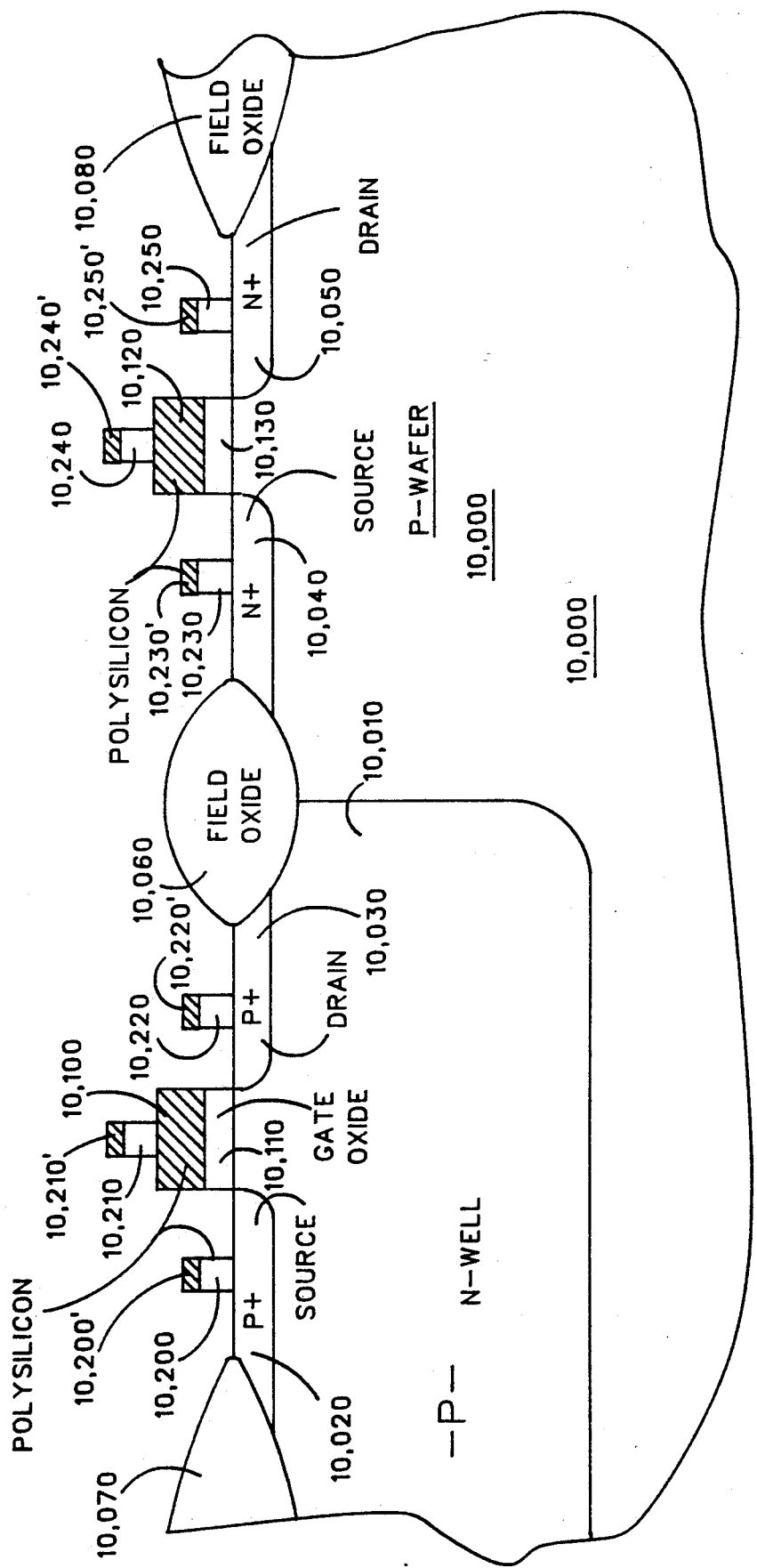
FIG. 64 shows the source, drain and gate contacts for both PMOS and NMOS being formed with nitride caps still over them.

In FIG. 64, a contact mask having six contact openings has been used, as herein before explained, to form the polysilicon contacts 10,200, 10,210, 10,220, 10,230, 10,240, and 10,250.

These contacts were delineated from a thin layer of nitride over the polysilicon during the etching step of removing the unprotected polysilicon. Thus, nitride caps 10,200', 10,210', 10,220', 10,230', 10,240', and 10,250' are visible over their respective contacts being formed in FIG. 64.

Figure 65:
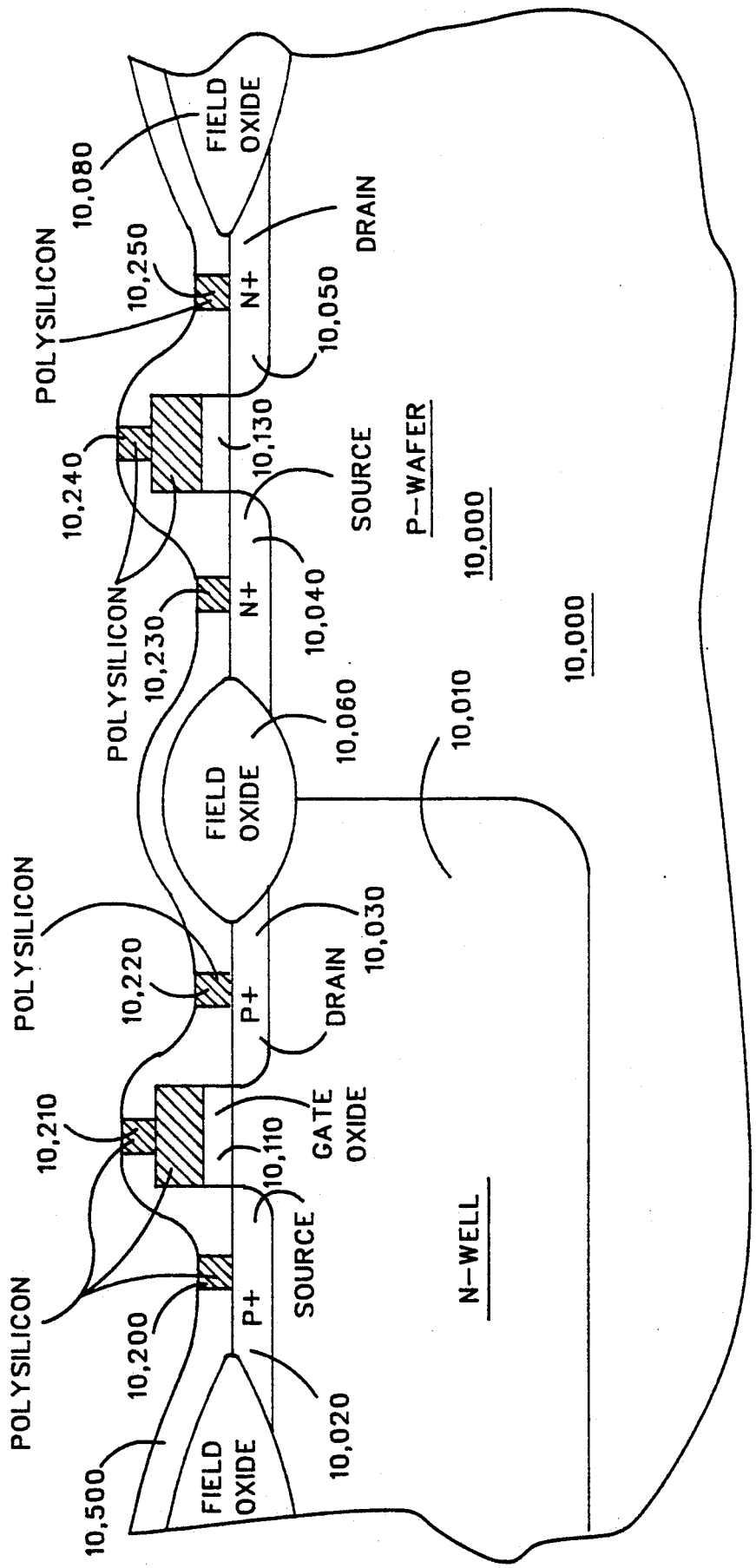
FIG. 65 shows the deposition of deposited oxide and spin on glass.

In FIG. 65, a layer of deposited oxide followed by spin on glass is shown at 10,500 covering the entire wafer. This layer has been etched down to remove the nitride caps, e.g. 10,200', and expose the tops of the contacts e.g. 10,200. This etching step also assists in planerization.

In FIGS. 66 and 67, N-type dopant is implanted into four contacts, being contact 10,210 (gate contact for the PMOS device), source and drain contacts 10,230 and 10,250 (for the NMOS device) and gate contact 10,240 for the NMOS device. This causes the polysilicon to be conductive suitable for contact purposes and in the case of the NMOS the dopant agrees with the underlying source, drain, and gate doping. PMOS gate 10,100 is also doped N-type when its contact 10,210 is doped.

The mask 10,600 of FIG. 66 was used in conventional photolithography processing to leave the photoresist 10,610 and 10,620 in location to protect the PMOS contacts from being doped by the N-type doping which is administered by the arrows shown in FIG. 67.

Figure 68:
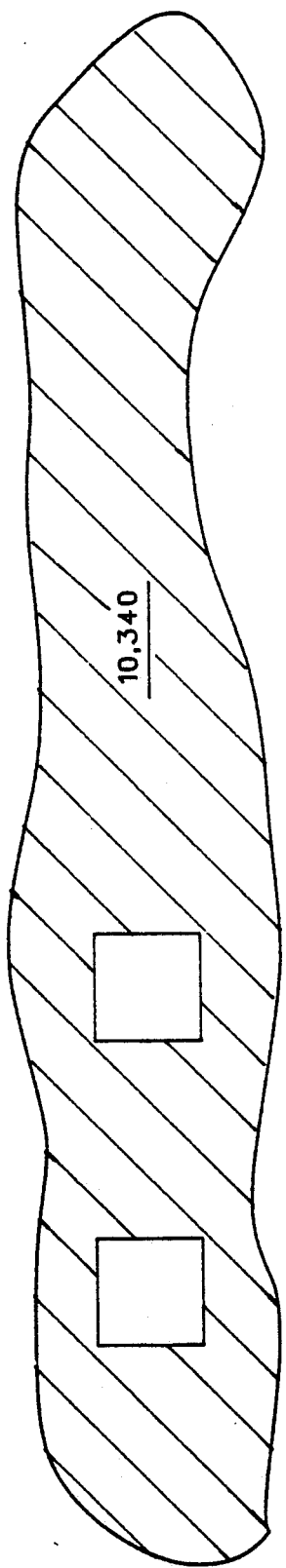
FIG. 68 shows the mask only permitting P implanting of the PMOS source and drain.
Figure 69:
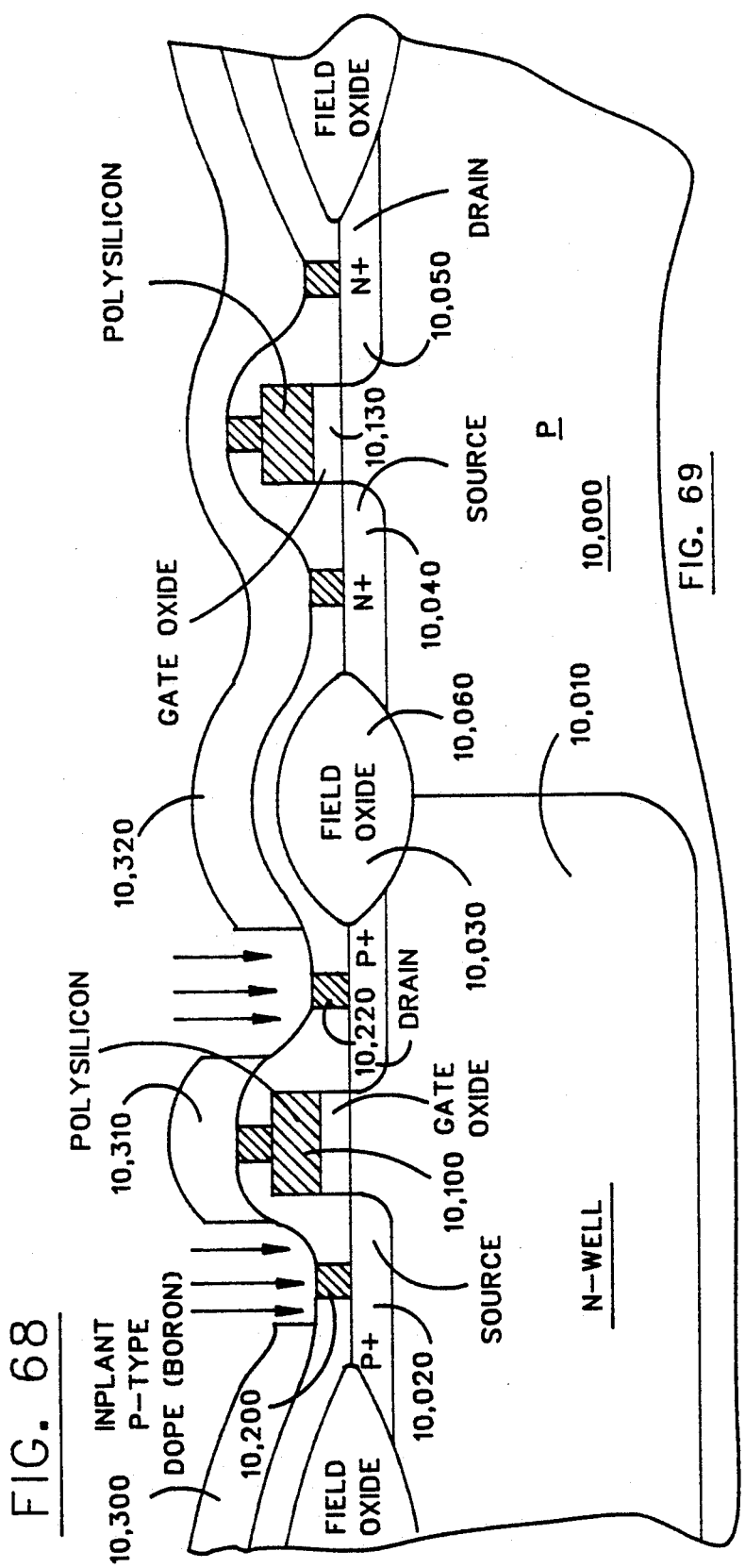
FIG. 69 shows the P doping of the PMOS source and drain.

FIGS. 68 and 69 show the doping of PMOS contacts 10,200 and 10,220 with P-type doping, conforming to their underlying source and drain doping. Mask 10,340 of FIG. 68 is utilized to open a photoresist coating to these contacts while protecting the remainder of the wafer by photoresist 10,300, photoresist 10,310 and photoresist 10,320.

In FIG. 70, a layer of metal, e.g. aluminum 11,000 covers the wafer 10,000 to a depth sufficient to cover all contacts including PMOS gate contact 10,210 and NMOS gate contact 10,240.

In FIG. 71, the metal layer 11,000 has been delineated to provide the PMOS source contact 10,200 with metal interconnect 11,010, PMOS gate contact 10,210 with metal interconnect 11,020, PMOS drain contact 10,220 with metal interconnect 11,030, NMOS source contact 10,230 with metal interconnect 11,040, NMOS gate contact 10,240 with metal interconnect 11,050, and NMOS contact 10,250 with metal interconnect 11,060.

While the structure of FIG. 71 represents a completed CMOS device, the silicide step of FIG. 72 has been included in dotted outline in order to show the expanded contact regions established by the silicide layers.

Referring back to FIG. 4, the silicide regions of FIGS. 71 and 72 can be opened in the same way utilizing the resist technique of original FIG. 4, by making the enlarged resist openings conform to the size of the source, drain and polysilicon gate. Thus, it may be seen that the silicide expanded contact area region 12,000 (FIGS. 71 and 72) over the PMOS source may be made large enough to cover the entire source region or simply a portion of it, depending upon the current capacity desired in the contacts.

Gate 21' corresponds to gate 21 of FIG. 4 in FIG. 72 and shows the silicide layer 12,100 thereover. Silicide layer 12,200 covers the PMOS drain.

Similarly, in the NMOS device of FIGS. 71 and 72, silicide area region 12,300 is shown covering the entire source, silicide region 12,400 covers the entire gate 21" and silicide region 12,500 covers the entire drain of the NMOS device. Once the step of FIG. 72 is performed at the FIG. 4 level, the remaining steps just described are equally applicable to this modification.

Figure 73:
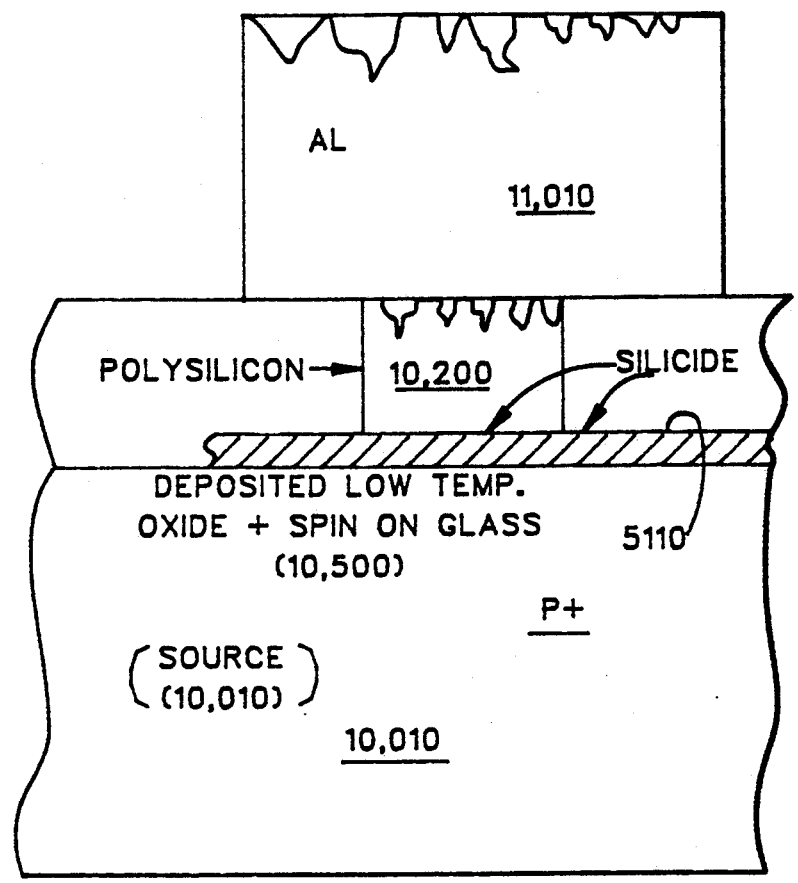
FIG. 73 shows an enlarged view of a contact.
Figure 74:
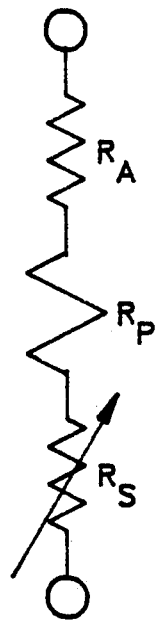
FIG. 74 shows the equivalent electrical circuit for FIG. 73.

FIGS. 73 and 74 show any one of the contacts e.g. contact 10,200 for the PMOS source greatly enlarged and relatively located in its normal position. Silicide layer 12,000 is shown between the source 10,020 and polysilicon contact 10,200. Contact 10,200 is of course the doped polysilicon formed on the silicide layer and surrounded by deposited (snowed-on) low temperature oxide, in turn covered by spin-on glass (10,500).

Aluminum interconnect 11,010 is shown over top of the contact 10,200, and slivers of aluminum penetrate the top portion of the contact. This junction is represented by resistor $R_A$ in the electrical equivalent circuit of FIG. 74, with the resistance of the polysilicon shown as resistor $R_P$ and the resistance of the silicide as $R_S$.

It will be understood that in the absence of silicide 12,000, the resistance $R_S$ would be much larger because it would have to represent the junction resistance between the silicon (source) 10,020 and the tiny polysilicon contact 10,200. Since the area of the silicide is much greater than the contact junction in the absence of silicide, the resistance $R_S$ is much lower which also enhances the current flow through contact 10,200. Resistors $R_A$ (aluminum 11,010 to polysilicon 10,200) and $R_P$ (polysilicon 10,200) remain unchanged.

I claim:

1. The method of making a sub-micron NMOS transistor using a wafer as a substrate therefor, comprising the steps of:

depositing a layer of oxide on a surface of the wafer;
depositing a layer of nitride over the oxide;
delineating an active region on the wafer by removing the oxide and nitride surrounding the active region;
growing field oxide surrounding the active region;
removing the oxide and nitride over the active region;
growing a gate oxide in the active region;
depositing a layer of polysilicon over the gate oxide;
delineating a gate of polysilicon in the active region, and removing the remainder of the polysilicon;
diffusing a first region into the active region of said wafer doped one way to comprise a source on one side of the gate;
diffusing a second region into the wafer, doped the same way, to comprise a drain on the other side of the gate;
depositing a further layer of polysilicon;
delineating a polysilicon whisker over each of the source, drain and the gate;
doping the whiskers over the source and drain the same as their underlying source and drain and doping the whisker over the gate and the gate at the same time;
surrounding the so-doped whiskers with plasma oxide covered by spin on glass;
planarizing the glass and exposing the tops of the whiskers; and,
disposing electrical interconnects to each of said whiskers.

2. The method of making a sub-micron NMOS transistor using a wafer as a substrate therefor, comprising the steps of:

diffusing a first region into a surface of said wafer doped one way to comprise a source;
diffusing a second region into the wafer, doped the same way, to comprise a drain;
constructing polysilicon whiskers above and in contact with the source and drain, respectively;
doping the whiskers the same as their underlying regions;
constructing a polysilicon gate over oxide covering the space between the source and drain and including a gate whisker above the gate;
surrounding the so-doped whiskers with plasma oxide covered by spin on glass;
planarizing the glass and exposing the tops of the whiskers; and,
disposing electrical interconnects to each of said whiskers; wherein the whiskers are of the order of 0.1 to 1.0 microns across as a result of snowing the plasma oxide onto them.

3. The method of claim 2, further comprising the step of:
establishing an area region of silicide between the whiskers and their respective regions and between the gate and its whisker in order to enhance available current carrying capacity for the whiskers.

4. The method of claim 3, wherein:
said silicide area regions are deposited on the source and drain regions and on the gate prior to the constructing of the whiskers.

5. The method of claim 4, wherein:
said silicide regions have respective areas several times the cross sectional dimensions of the whiskers in order to make room for an increased number of atoms to be in position to release electrons for whisker current flow.

6. The method of making a sub-micron CMOS transistor, using a wafer as a substrate therefor, comprising the steps of:

using a P doped wafer;
implanting an N doped well in the substrate;
depositing a layer of oxide on a surface of the wafer;
depositing a layer of nitride over the oxide;
delineating an active region on the wafer in the N well for a PNP device and delineating a further active region outside the N well for an NPN device by removing the oxide and nitride surrounding each active region;
growing field oxide surrounding the active regions;
removing the oxide and nitride over each active region;
growing a gate oxide in the active regions;
depositing a layer of polysilicon over the gate oxide;
delineating a gate of polysilicon for the PNP device and for the NPN device, and removing the remainder of the polysilicon and removing the oxide not under the gates;
diffusing P+ regions into the PNP active region to comprise a source and drain on respective sides of the PNP gate;
diffusing N+ regions into the NPN active region to comprise a source and a drain on respective sides of the NPN gate;
depositing a further layer of polysilicon;
delineating a polysilicon whisker over each of the sources, drains and the gates;
doping the whiskers over the sources and drains the same as their underlying regions and doping the whiskers over the gates and the gates at the same time;
surrounding the so-doped whiskers with plasma oxide covered by spin on glass;
planarizing the glass and exposing the tops of the whiskers; and,
disposing electrical interconnects to each of said whiskers.

7. The method of making a sub-micron CMOS transistor, comprising the steps of:

using a P doped wafer;
diffusing a first region into the wafer doped N to comprise an NMOS source;
diffusing a second region into the wafer, doped the same way, to comprise an NMOS drain;
diffusing an N-well into the wafer;
diffusing a PMOS P doped source and drain into the N-well;
constructing polysilicon whiskers above and in contact with the sources and drains, respectively;
doping the whiskers the same as their underlying regions;
constructing a doped polysilicon NMOS gate over oxide covering the space between the NMOS source and drain and including a gate whisker above the NMOS gate;
constructing a doped polysilicon PMOS gate over oxide covering the space between the PMOS source and drain and including a gate whisker above the PMOS gate;
surrounding the so-doped whiskers with plasma oxide covered by spin on glass;
planarizing the glass and exposing the tops of the whiskers; and,
disposing electrical interconnects to each of said whiskers, wherein the whiskers are of the order of 0.1 to 1.0 microns across as a result of snowing the plasma oxide onto them.

8. The method of claim 7, further comprising the step of:

establishing an area region of silicide between the whiskers and their respective regions and between the gate and its whisker in order to enhance available current carrying capacity for the whiskers.

9. The method of claim 8, wherein:

said silicide area regions are deposited on the source and drain regions and on the gate prior to the constructing of the whiskers.

10. The method of claim 9, wherein:

said silicide regions have respective areas several times the cross sectional dimensions of the whiskers in order to make room for an increased number of atoms to be in position to release electrons for whisker current flow.

* * * * *